(12) United States Patent
Cherian

(10) Patent No.: US 7,598,758 B2
(45) Date of Patent: Oct. 6, 2009

(54) MP3 MICRO PROBE

(76) Inventor: Gabe Cherian, P.O. Box 1335, Sun Valley, ID (US) 83353

( * ) Notice: Subject to any disclaimer, the term of this patent is extended or adjusted under 35 U.S.C. 154(b) by 210 days.

(21) Appl. No.: 11/752,942

(22) Filed: May 24, 2007

(65) Prior Publication Data

US 2007/0210816 A1    Sep. 13, 2007

Related U.S. Application Data

(62) Division of application No. 11/208,285, filed on Aug. 18, 2005, now Pat. No. 7,227,369.

(51) Int. Cl.
*G01R 31/02* (2006.01)
(52) U.S. Cl. .................................... 324/754
(58) Field of Classification Search ............... 324/754, 324/761, 762, 765, 158.1; 257/48; 438/14–18
See application file for complete search history.

(56) References Cited

U.S. PATENT DOCUMENTS

| 4,918,383 | A | * | 4/1990 | Huff et al. ................. 324/757 |
| 5,914,613 | A | * | 6/1999 | Gleason et al. ............ 324/754 |
| 6,507,207 | B2 | * | 1/2003 | Nguyen .................... 324/761 |

* cited by examiner

*Primary Examiner*—Ha Tran T Nguyen
*Assistant Examiner*—Tung X Nguyen

(57) ABSTRACT

Described are methods of using probes, for making electrical contact to high-density chips or similar electronic devices. Two groups of probes are covered. The first group includes probes that are moved laterally, parallel to the surface of the contact pads of the device under test, after the initial contact has been made. This is to create the desired wipe or scrub. The second group includes probes that operate on the principle of suction cups. When the probe is pushed against the device under test, the probe working tips stretch outwardly and create the desirable wipe or scrub. Described also are the probes themselves that are used for the above methods. In this divisional application, the emphasis is on the first group.

20 Claims, 20 Drawing Sheets

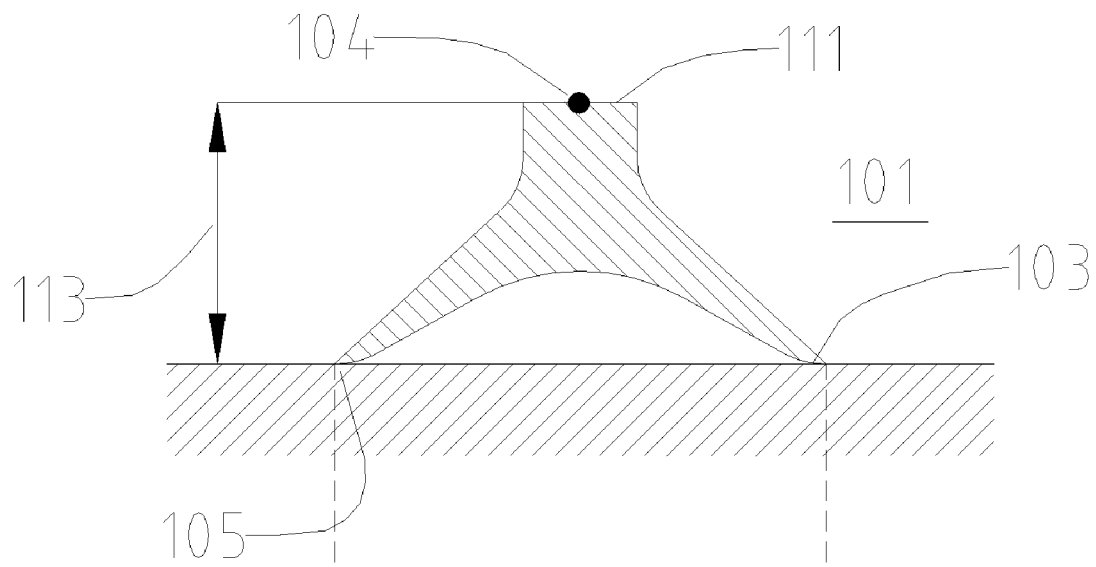
(PRIOR ART)
FIG. 12-A
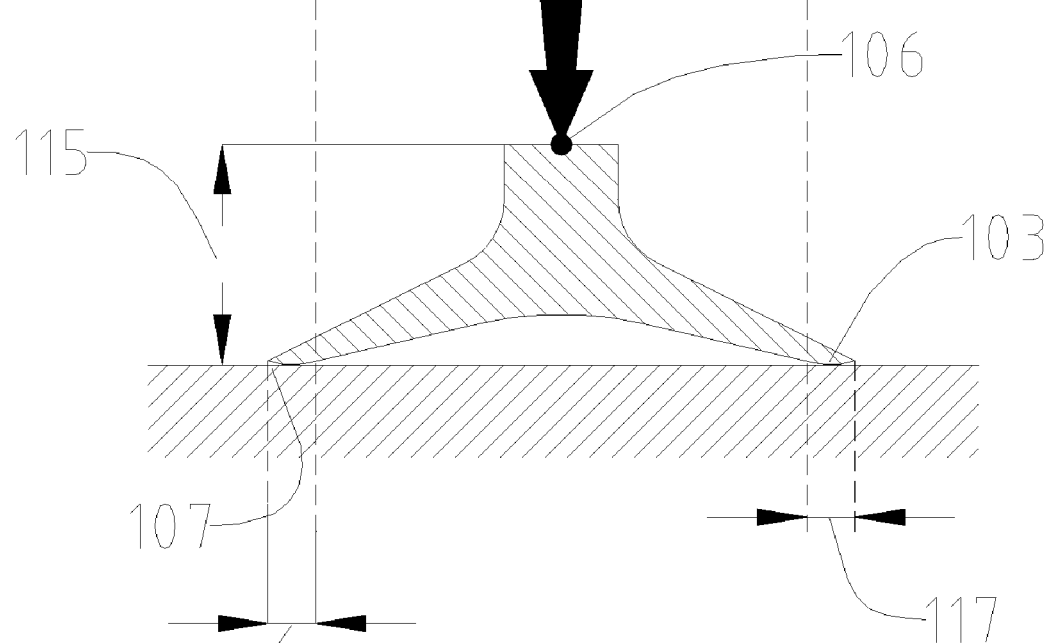
(PRIOR ART)
FIG. 12-B

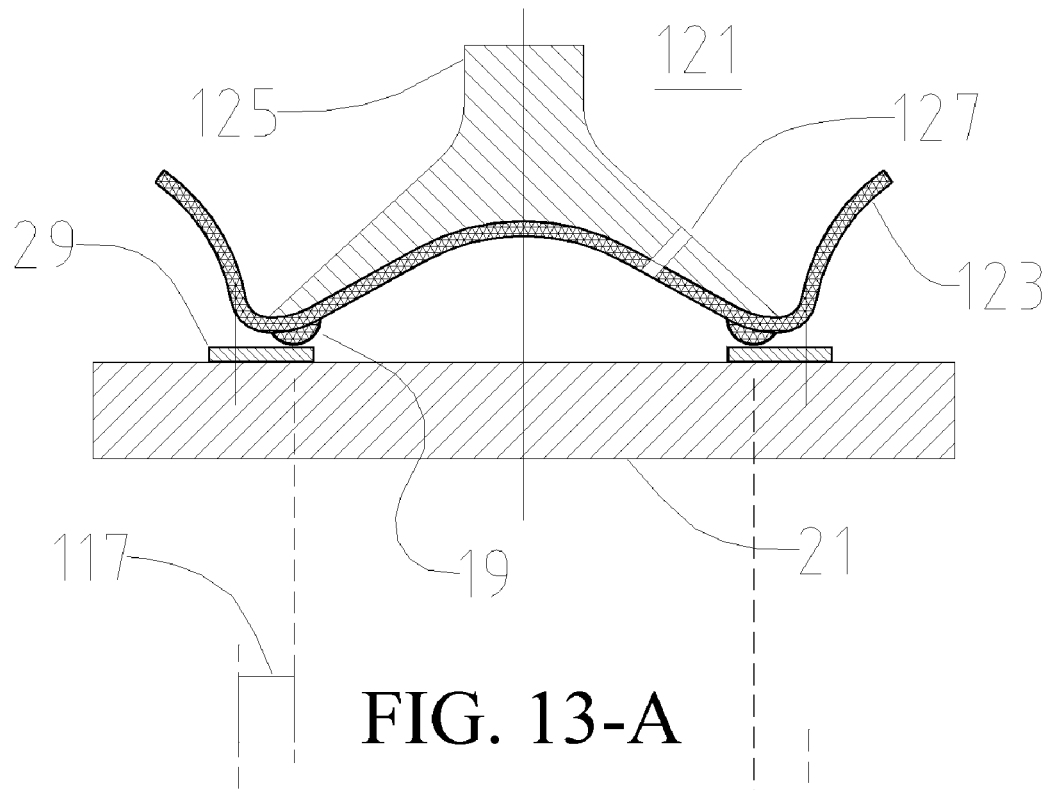
FIG. 13-A
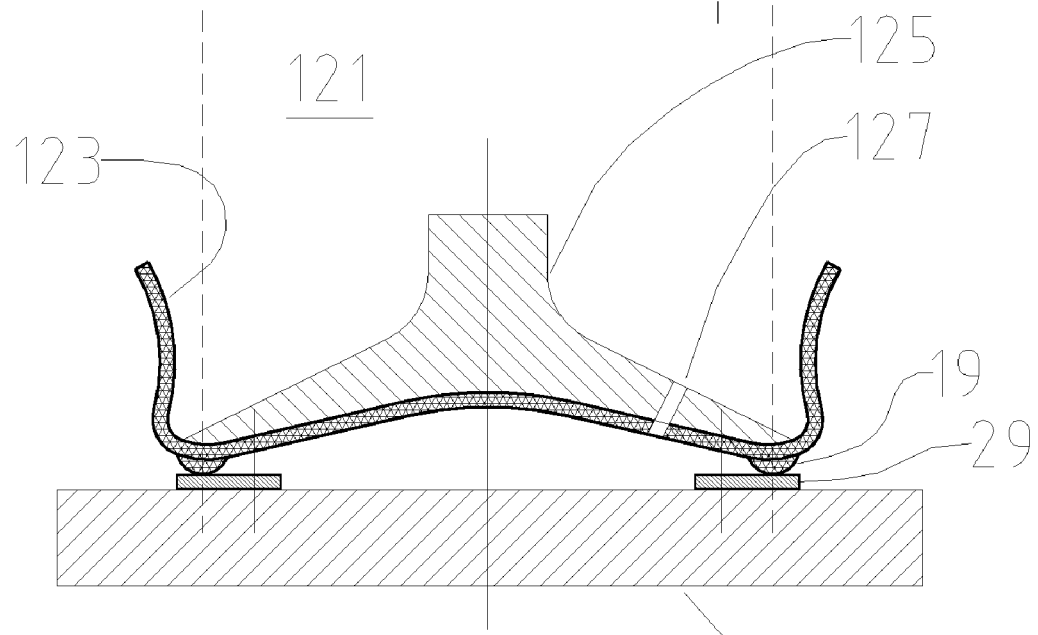
FIG. 13-B

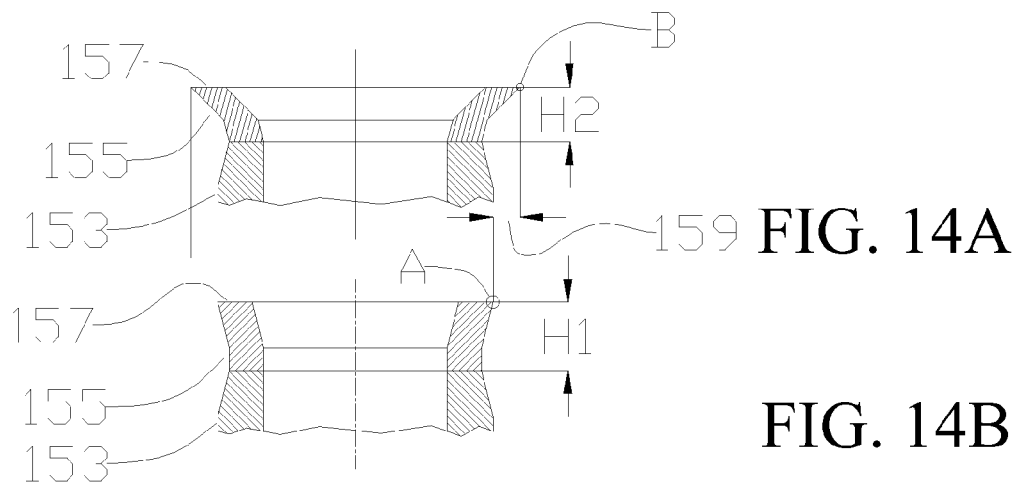
FIG. 14A
FIG. 14B
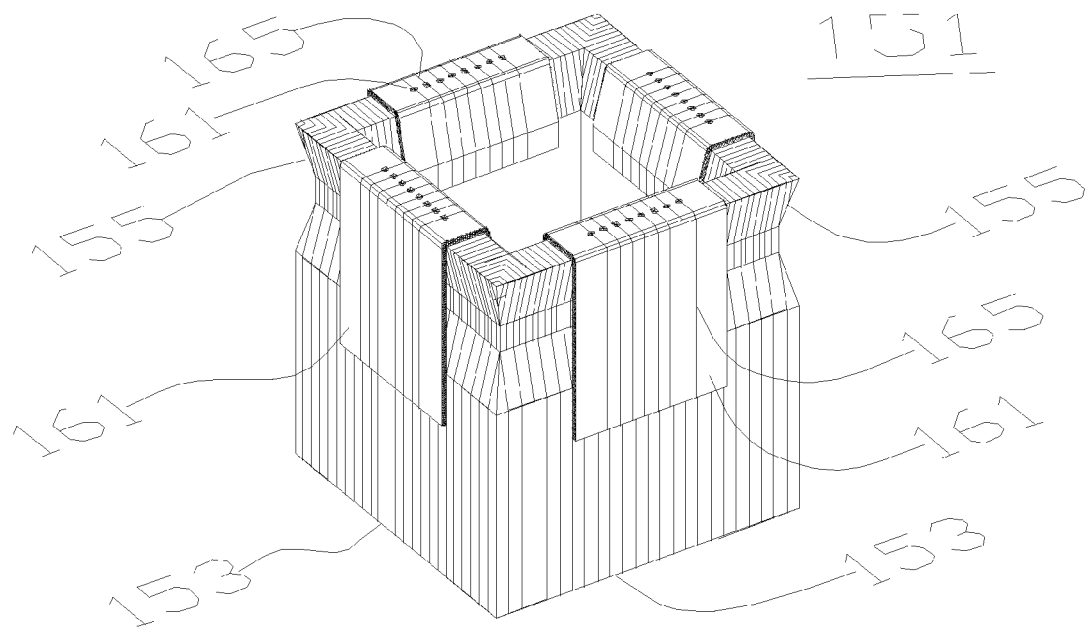
FIG. 14C

MP3 MICRO PROBE

CROSS-REFERENCE TO RELATED APPLICATIONS

This application is a DIVISIONAL non-provisional utility patent application, divisional from prior non-provisional patent application Ser. No. 11/208,285, filed on Aug. 18, 2005, now U.S. Pat. No. 7,227,369 entitled "MICRO PROBE 2", and it is claiming the priority and benefits of the mother application and the related following Provisional and Non-Provisional Patent Applications, all of which are incorporated herein in their entirety by reference:
1. Non-Provisional patent application Ser. No. 11/208,285, filed on Aug. 18, 2005, entitled "MICRO PROBE 2", which will be referred to as Ref1. This application is scheduled to be granted a U.S. Pat. No. 7,227,369, to be issued on Jun. 5, 2007.
2. Non-Provisional patent application Ser. No. 10/391,964, filed on Mar. 19, 2003, entitled "Micro Probe", which will be referred to as Ref2. This application was granted a U.S. Pat. No. 7,015,707, which was issued on Mar. 21, 2006.
3. Provisional Patent Application Ser. No. 60/366,294, filed on Mar. 20, 2002, entitled "Lamp Sockets & Micro-Probes", which will be referred to as Ref3. This Provisional Patent Application had in turn referred to the following Provisional and Non-Provisional Patent Applications, all of which are incorporated herein in its entirety by reference:
4. Non-Provisional Utility patent application Ser. No. 09/947,240, filed on Sep. 5, 2001, entitled "Interconnection Devices", which in turn had claimed the priority and benefits of the following three provisional patent applications.
5. Provisional Patent Application Ser. No. 60/268,467, filed Feb. 12, 2001, entitled "Probes, Sockets, Packages & Columns",
6. Provisional Patent Application Ser. No. 60/257,673, filed Dec. 22, 2000, entitled "Probes and Sockets", and
7. Provisional Patent Application Ser. No. 60/231,387, filed Sep. 8, 2000, entitled "Probers",

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The present invention generally relates to electrical connectors, and more particularly relates to high-density electrical connectors used in test and burn-in done on miniaturized electrical components.

This invention is a technology platform that enables the interconnection between high-density electronic devices. It particularly covers "probes" and probe arrangements, and probe actuations, to achieve high-density interconnection between these probes and high-density devices, such as chips and wafers.

The invention also relates more specifically to membrane probes, which are used in conjunction with special actuation systems, and which promote and control wipe or scrub.

2. Background Information

It is standard procedure to test chips or integrated circuits at different production stages to cull out the defective ones. Such tests are often done on printed circuit boards, substrates and similar electronic devices as well. This is done to avoid putting extra time, money and effort into a defective component or device only to end up having to scrap the component, and whatever assemblies that may have incorporated that component or device, at the end of the production process. Such testing is done using probes and probe cards. Many times when devices are tested, they undergo what is known as test and burn-in. A probe is used to test the devices or packages, and heat and sometimes electricity are applied to accelerate the aging or testing process. What is needed is a system that will allow these probes to be easily interchanged and to also reduce the size of the pitch or the distance between the contact elements within the probes to allow contact with the contact pads of miniaturized electronic devices.

3. Prior Art

U.S. Pat. No. 5,914,613, issued Jun. 22, 1999, to Gleason et al, titled "Membrane Probing System with Local Contact Scrub, comes pretty close to some of the features described in this present patent application. However, I feel that what I have described here and what I have claimed in this present patent application covers different novel ideas, especially since I am using combinations of features that are covered by Gleason.

I will abide by the decision of the Patent Examiner, as to whether my inventions here are outside the scope of Gleason or not, and whether my claims are allowable over Gleason.

SUMMARY OF THE INVENTION

As the electronics industry has become more advanced, the chips and components, and electronic devices in general, have become smaller and smaller. A resulting problem is that many present probes are too large, or have their contact elements too large, to work with many of the products which are now available. This results in increased cost to the manufacturers, who must test the devices through more expensive means.

Non-Provisional Utility patent application Ser. No. 09/947,240, filed on Sep. 5, 2001, entitled "Interconnection Devices" covers probes which use discrete contact springs or needles. The needles need to be strong enough to withstand handling and to provide the required contact forces. Because of manufacturing constraints, the smallest needles that can be made are about 0.003" or 0.004" in diameter or thereabout. The pitch would then be approx. twice as large as the diameter of the needles or springs, i.e. approx. 0.005" to 0.008".

If we want to probe devices that have contact pads on smaller pitch, pitch in the range of 50 micron, i.e. 0.00125 inch or thereabout, discrete needles would not be able to do it.

The present invention addresses such needs. It addresses probing of devices with such High-Density or Small Pitch. It also creates probes with better Impedance Control and also provides the desirable Wipe or Scrub.

The basic goal is to provide contact points that can be located on small, effective center distances to correspond to the center distances of contact pads on chips, wafers, packages, substrates or boards and similar devices. This should also cover a small area or footprint of the devices. Another general goal is to provide a way to support and guide the contact means, and to locate them precisely, where they contact the device under test (DUT). This will reduce the chance of deforming the contact means and keeps them in close alignment. One more goal is to provide adequate wipe or scrub action at the contact points, thus requiring small forces to break through the undesirable layers on top of the contact pads of the DUT. Yet another goal is to electrically shield the contact points and/or make them with controlled impedance to perform like coaxial cables. This would be accomplished by providing an insulating cover, layered over the contact points, and then providing another layer of conductive material that can be grounded.

Still other objects and advantages of the present invention will become readily apparent to those skilled in this art from the following detailed description wherein I have shown and described only the preferred embodiments of the invention, simply by way of illustration of the best modes contemplated by carrying out my invention. As will be realized, the invention is capable of modification in various obvious respects all without departing from the invention. Accordingly, the drawings and description of the preferred embodiment are to be regarded as illustrative in nature, and not as restrictive.

BRIEF DESCRIPTION OF THE SEVERAL VIEWS OF THE DRAWINGS

Brief Description of the Drawings

Figure 23:
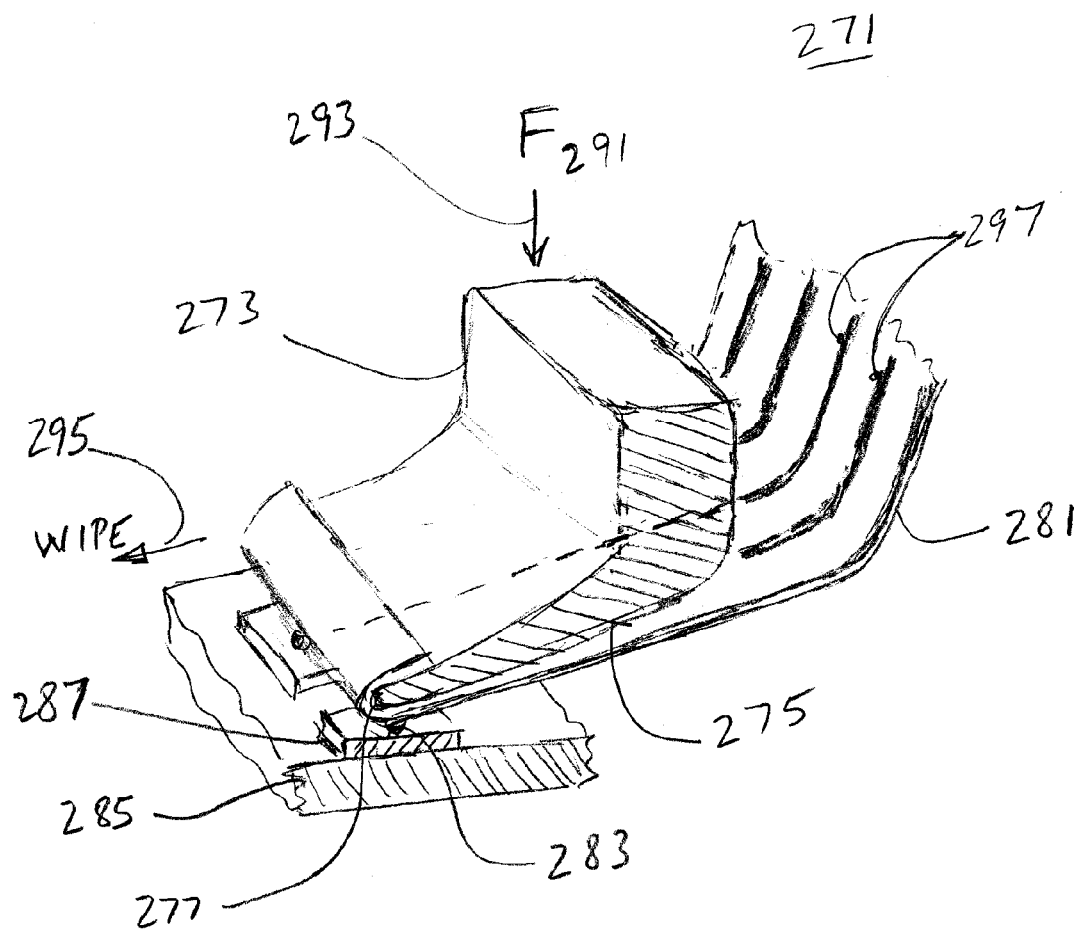
Figure 24:
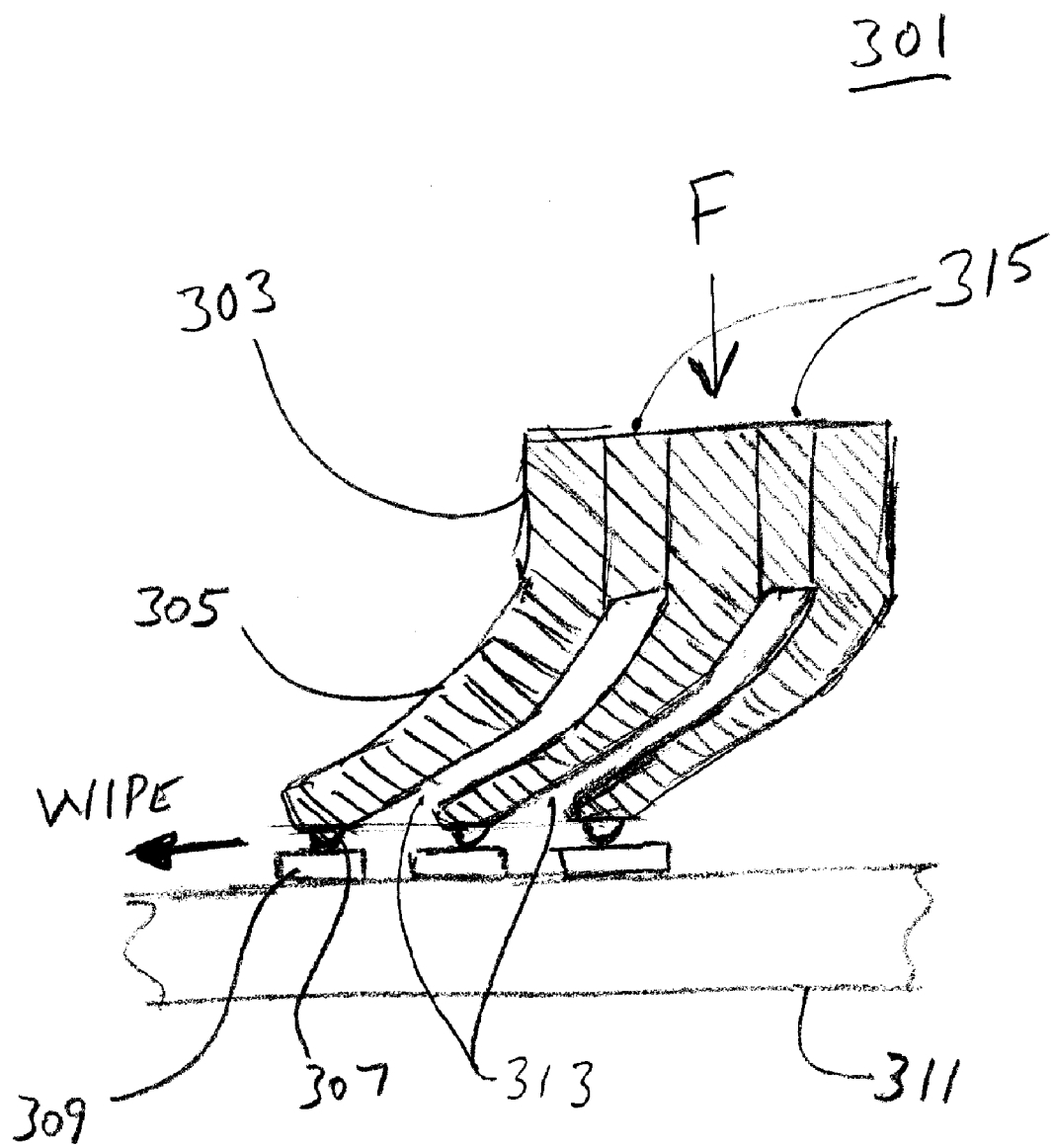

Most of the drawings in these specifications, FIGS. 1 through 22, are copies of those figures with corresponding numbers, which were included with Refl, i.e. Provisional Patent Application Ser. No. 60/366,294, filed on Mar. 20, 2002, entitled "Lamp Sockets & Micro-Probes". I just cleaned them up a little bit, and added the reference characters. However, FIGS. 23 and 24 are new.

Here is a brief description of the drawings.

FIGS. 1 through 4 show the membrane probe stretched within a frame and pushed down against the DUT by the pusher, and moved sideways to create the desirable wipe or scrub.

Figure 5:
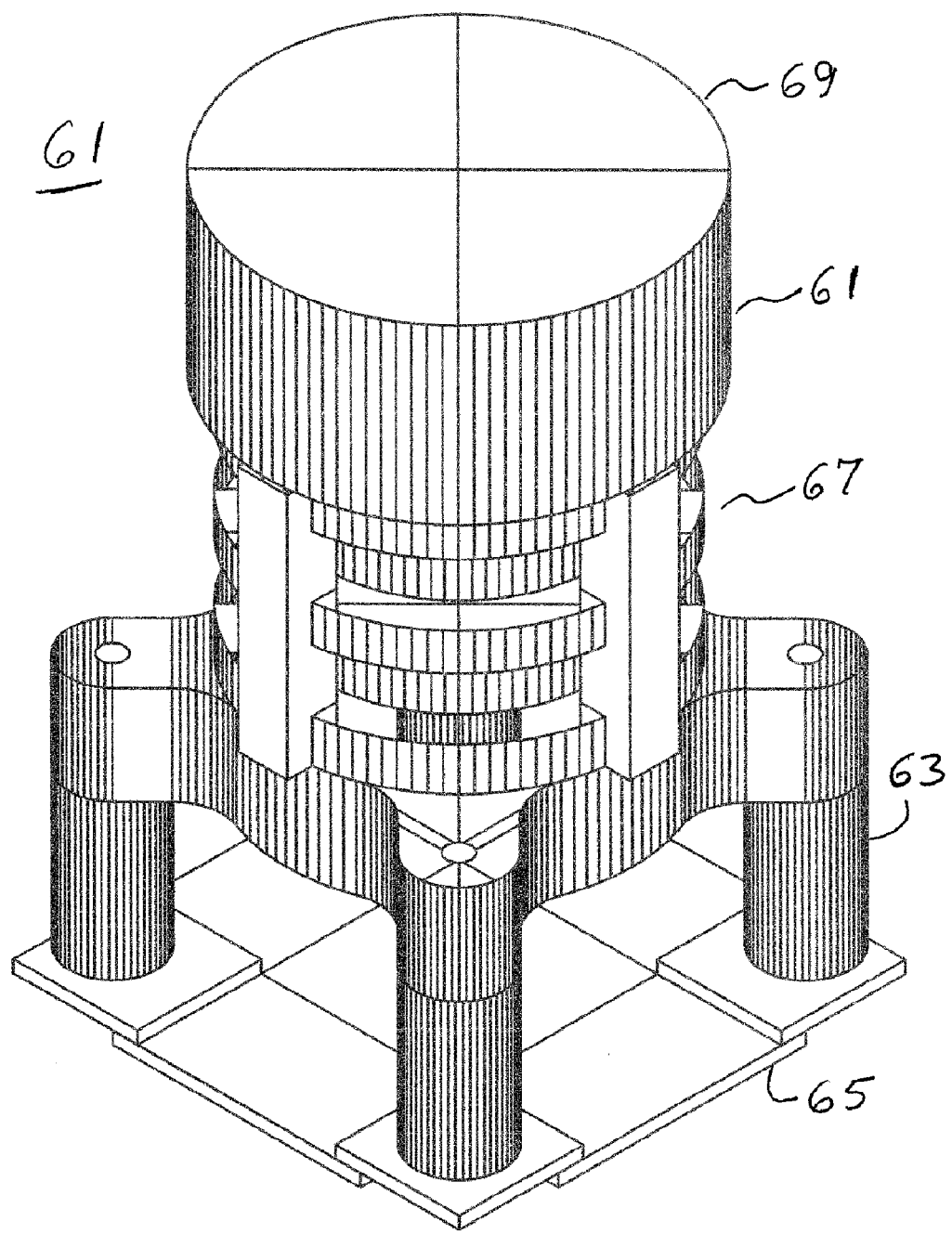

FIG. 5 shows an example of a tool, which would carry the frame and would move the pusher up and down and move the membrane sideways.

Figure 6:
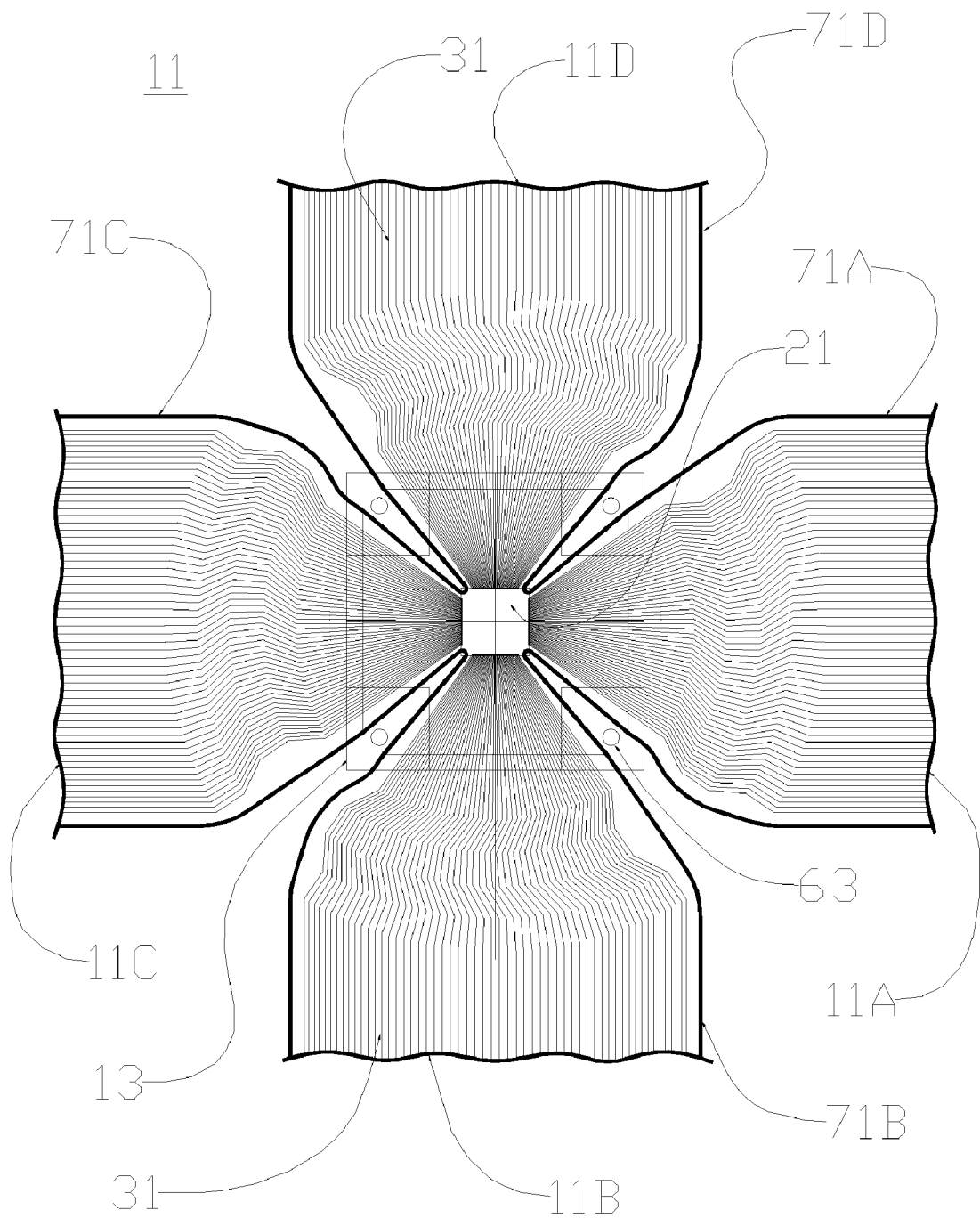

FIG. 6 shows the membrane. One part of the membrane is captured by the frame and is geared to interact with the device under test, while the rest of the membrane is outside the frame and is supposed to conduct the signals from the DUT to the outside world and vice versa.

Figure 7:
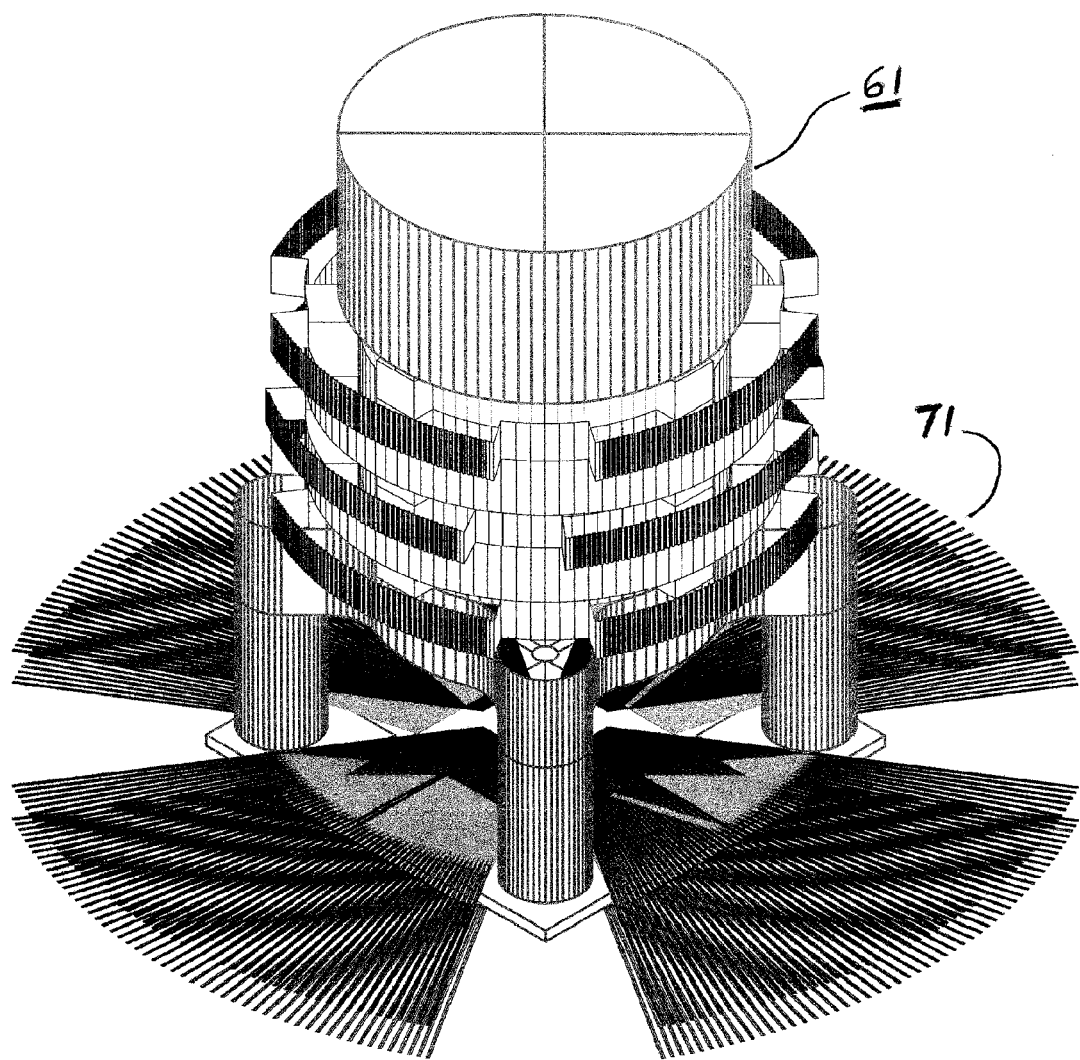

FIG. 7 shows the tool, which was shown in FIG. 5, together with the membrane, which was shown in FIG. 6. The figure tries to illustrate the motion of the membrane when it is pushed down and then released to move back up to its resting position. It was difficult to show, at the same time, the sideways motion, but the figure simply tries to illustrate the intricate motion of the membrane.

Figure 8:
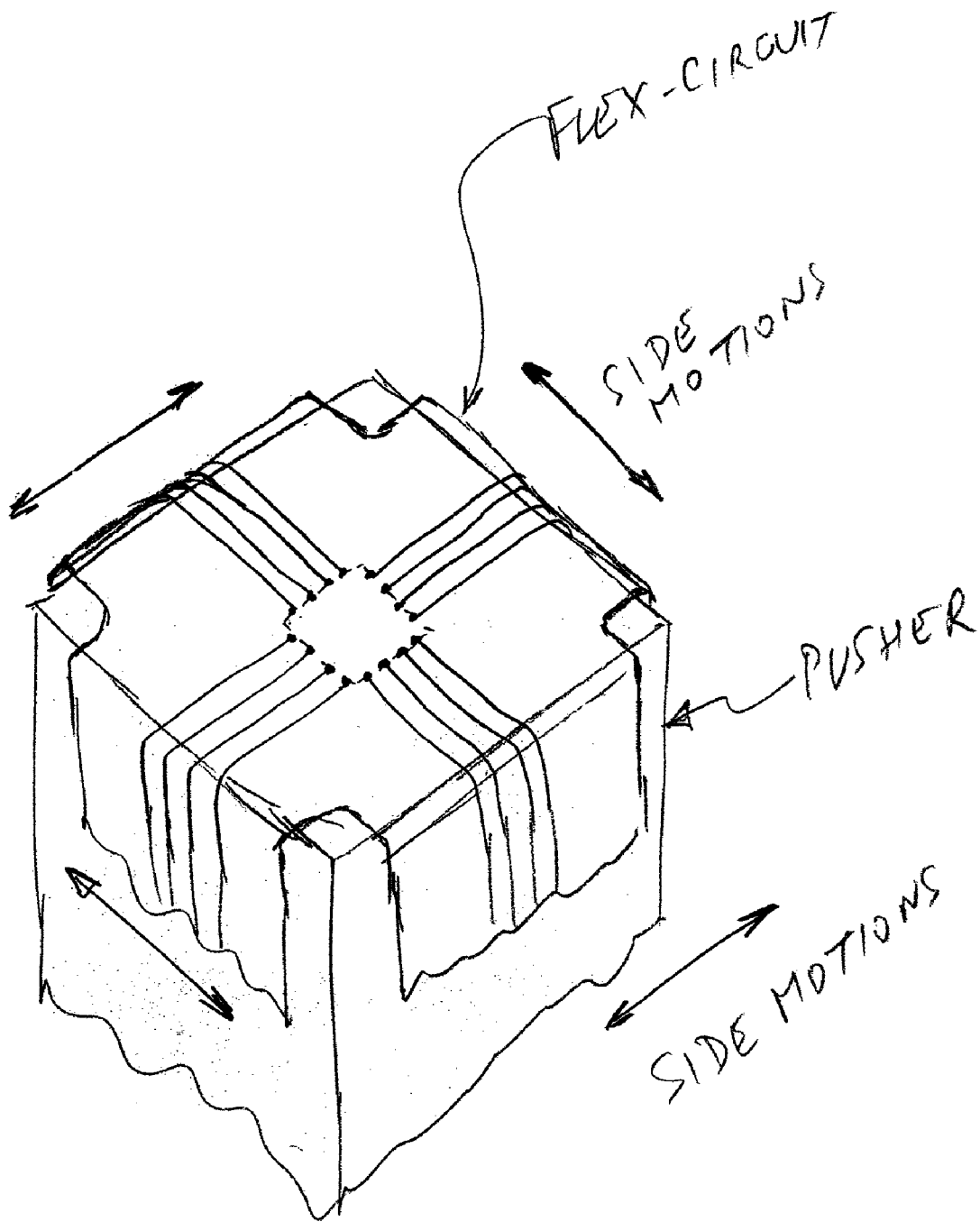

FIG. 8 shows the tip of the pusher with the membrane draped over it.

Figure 9:
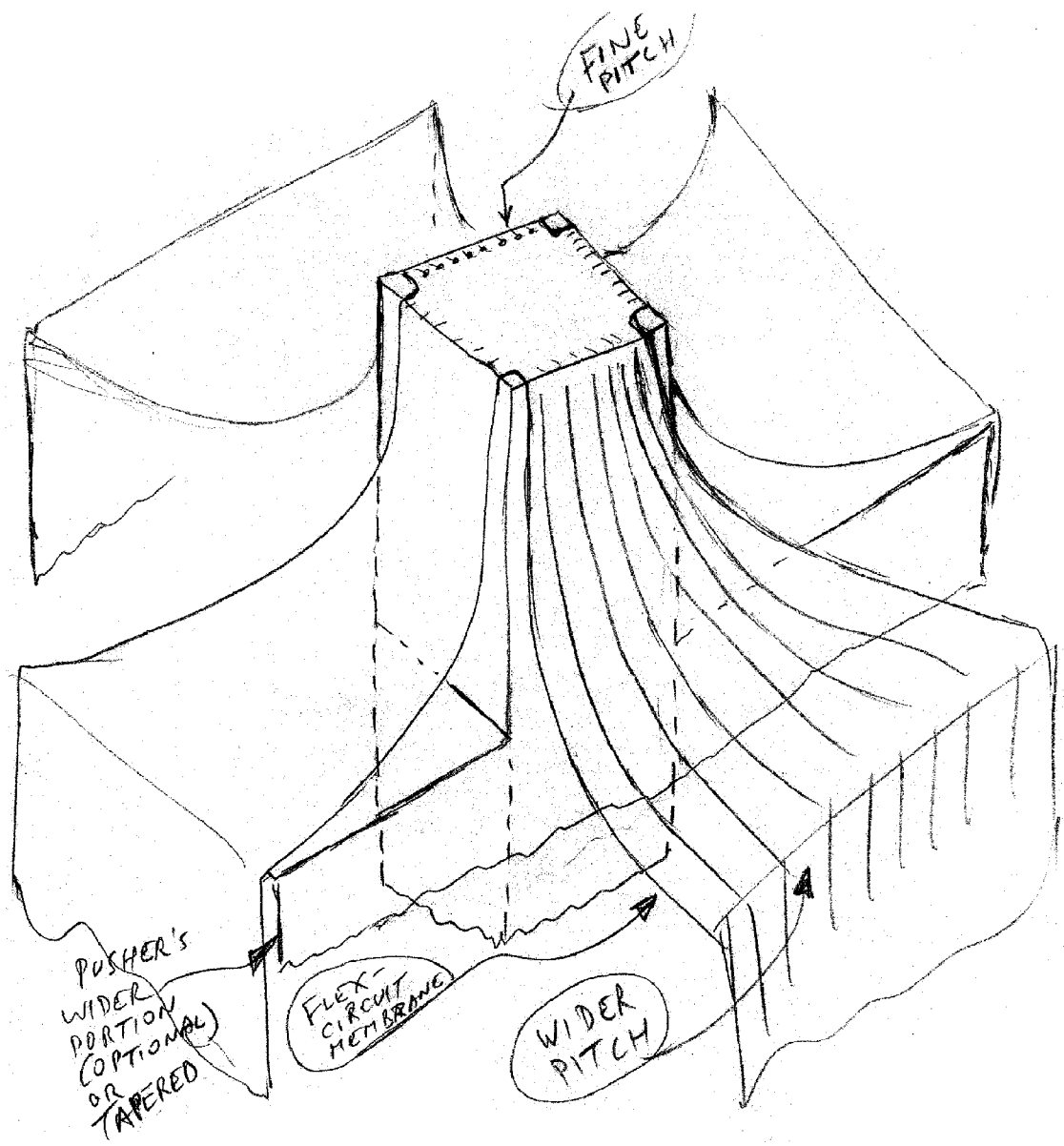

FIG. 9 shows the tip of a tapered pusher, together with the membrane attached to the tip of the pusher, and tries to illustrate the fact that the membrane can flare wider as it goes farther from the pusher tip.

Figure 10:
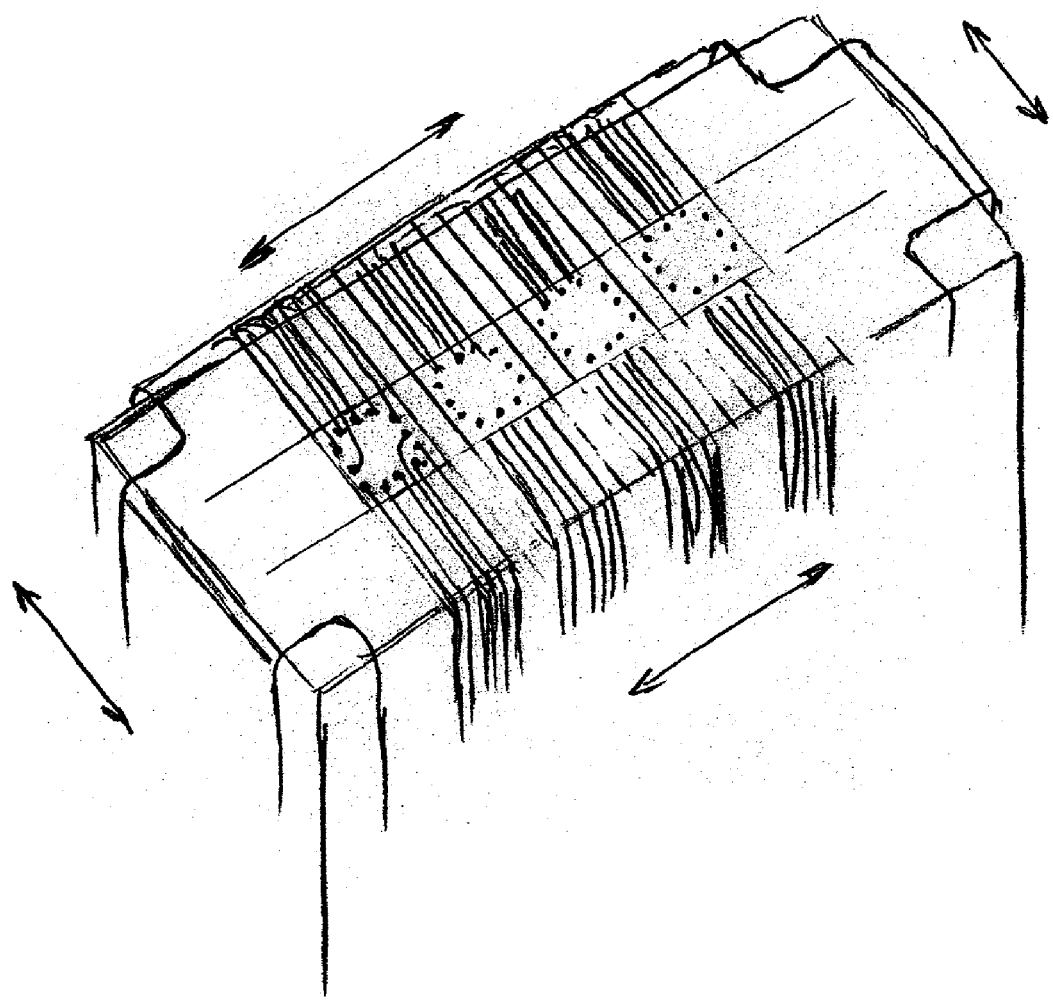

FIG. 10 shows a membrane that can make contact with more than one device under test.

Figure 11:
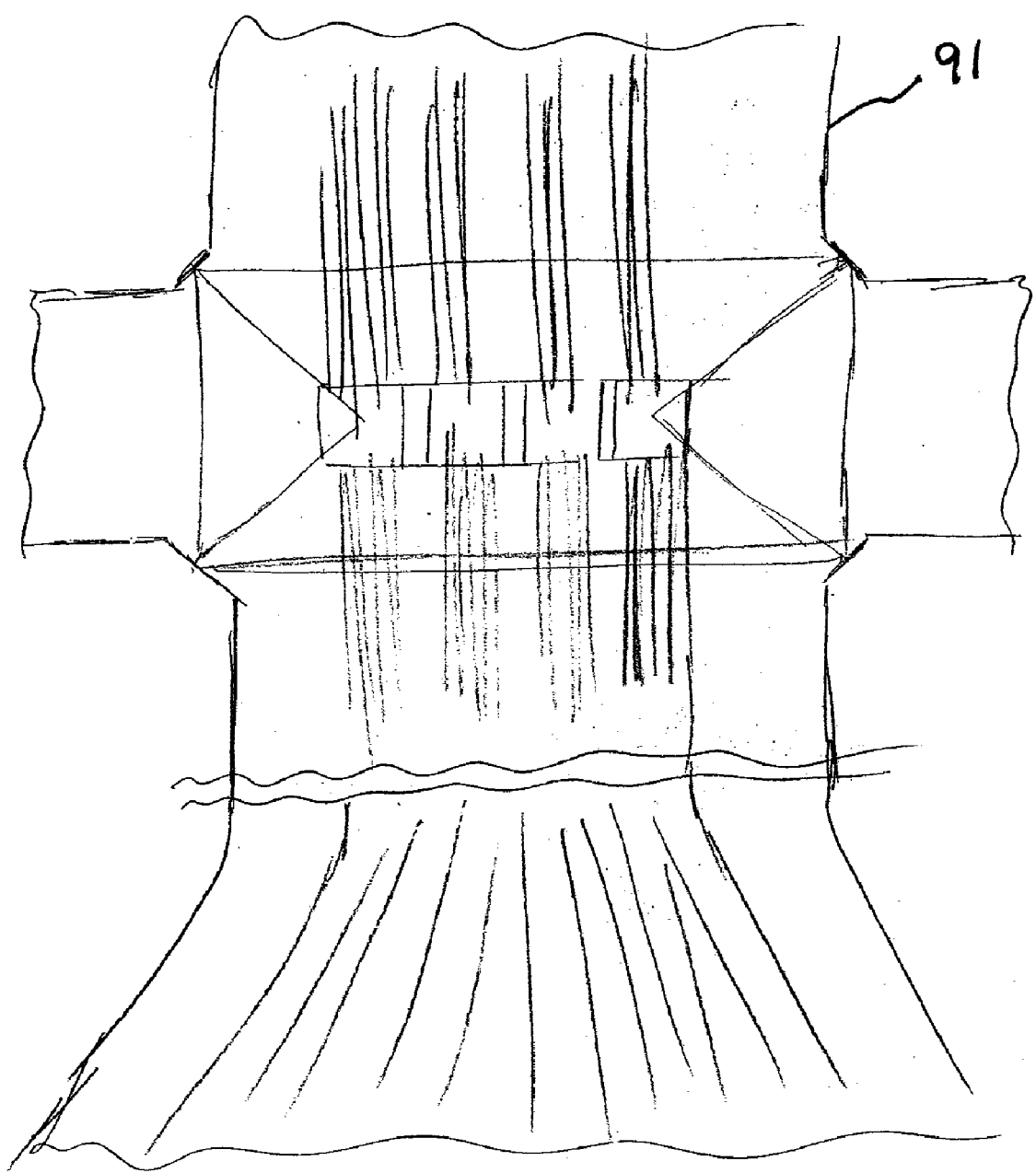

FIG. 11 shows a portion of the membrane shown in FIG. 10, while it is spread out flat.

FIGS. 12-A and 12-B show a conventional suction cup and how the rim/lip stretches out, when the top of the cup is compressed.

FIGS. 13-A and 13-B show how we could utilize the "suction cup" model, to create a probe that provides wipe or scrub when we compress the probe against the device under test.

FIGS. 14A, 14B and 14C show a probe that utilizes the suction cup model to create wipe or scrub when the probe is pushed against the device under test.

Figure 15:
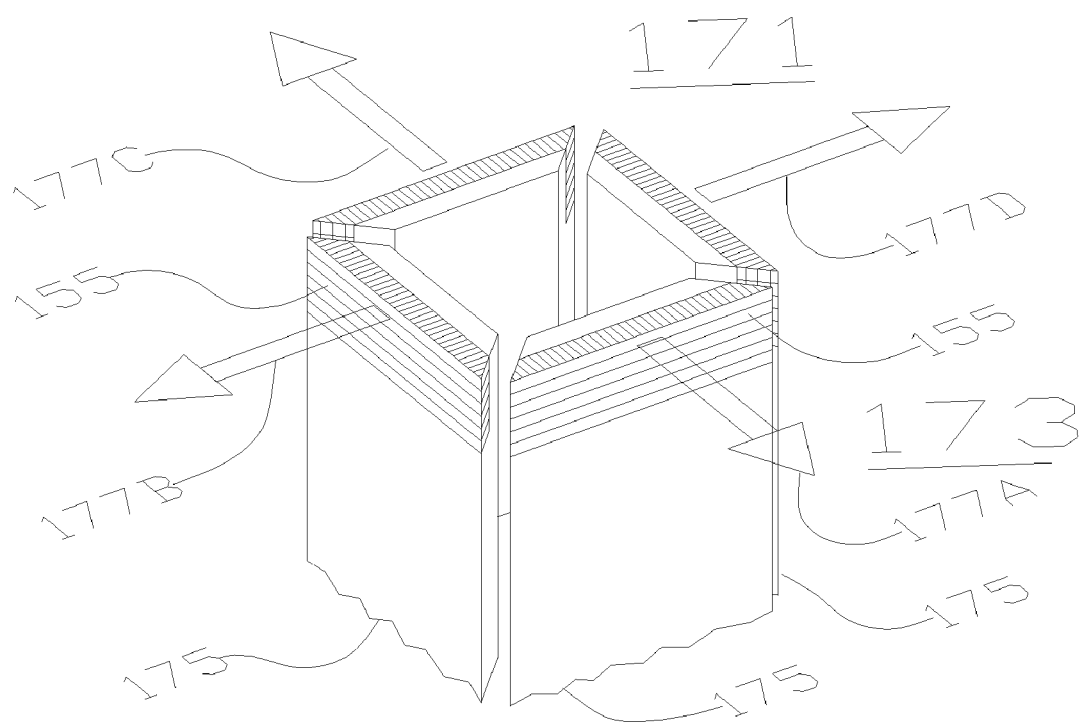

FIG. 15 shows a probe, whose pusher is segmented and the segments are articulated, so as to duplicate the effect of the suction cup model.

Figure 16:
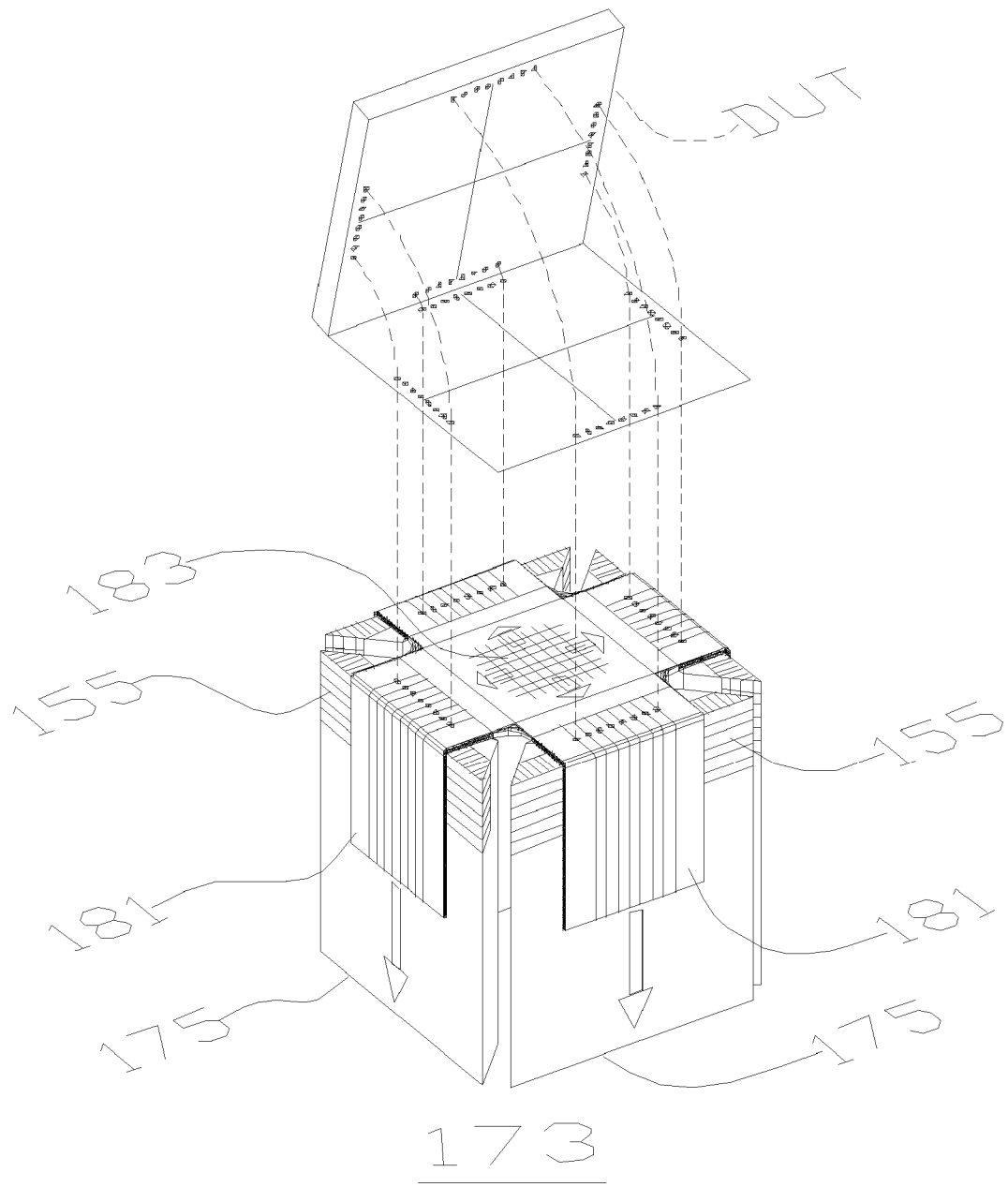

FIG. 16 shows the probe shown in FIG. 15, but it is shown with the membrane draped over the pusher.

Figure 17:
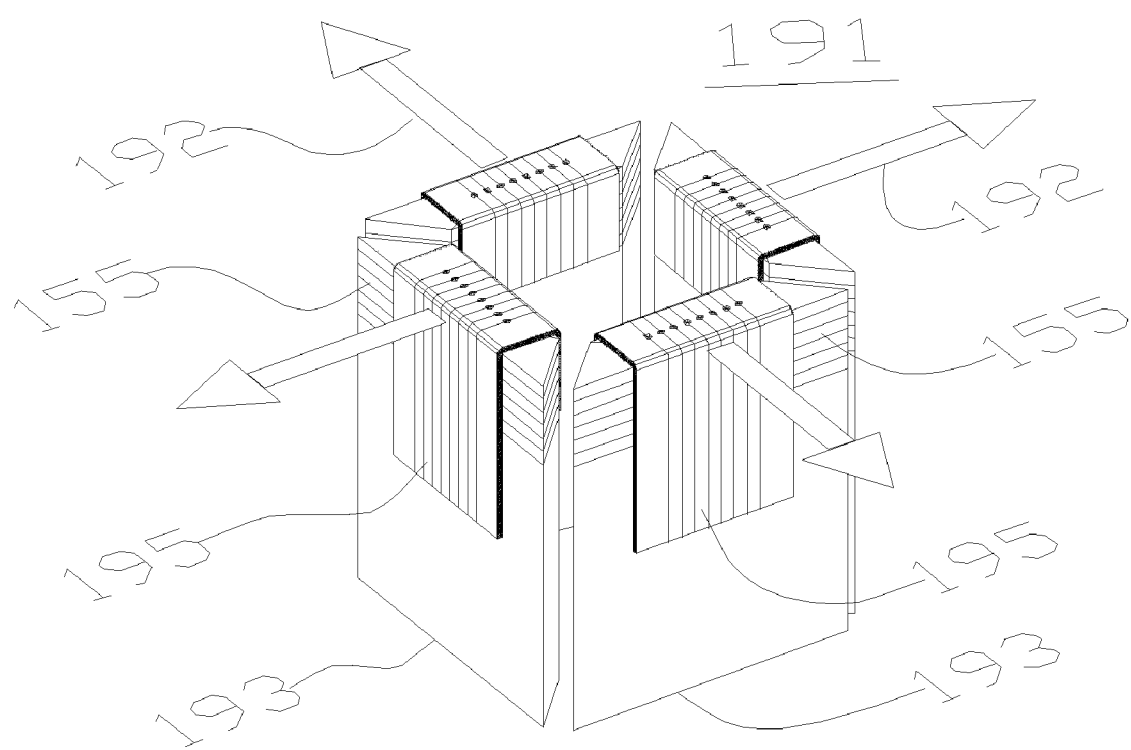

FIG. 17 shows a probe similar to the one shown in FIG. 16, except that the membrane is provided in separate individual segments.

Figure 18:
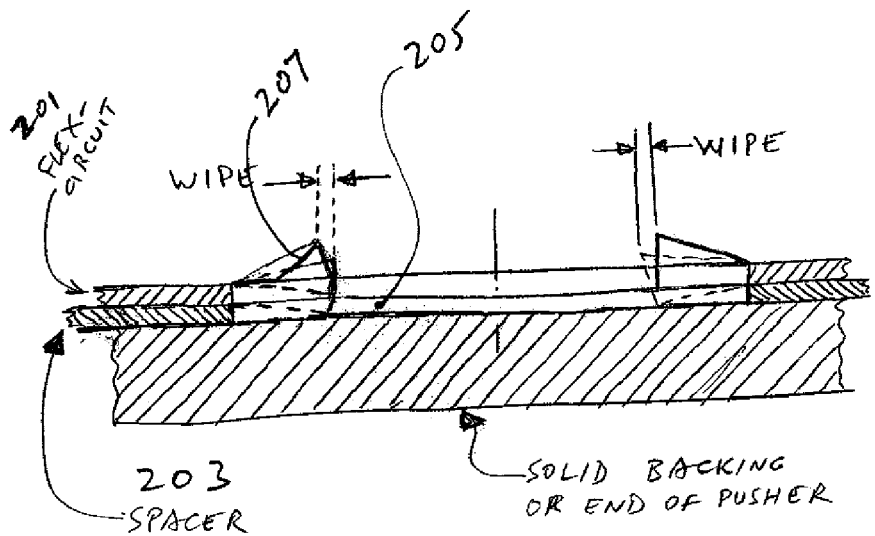
Figure 19:
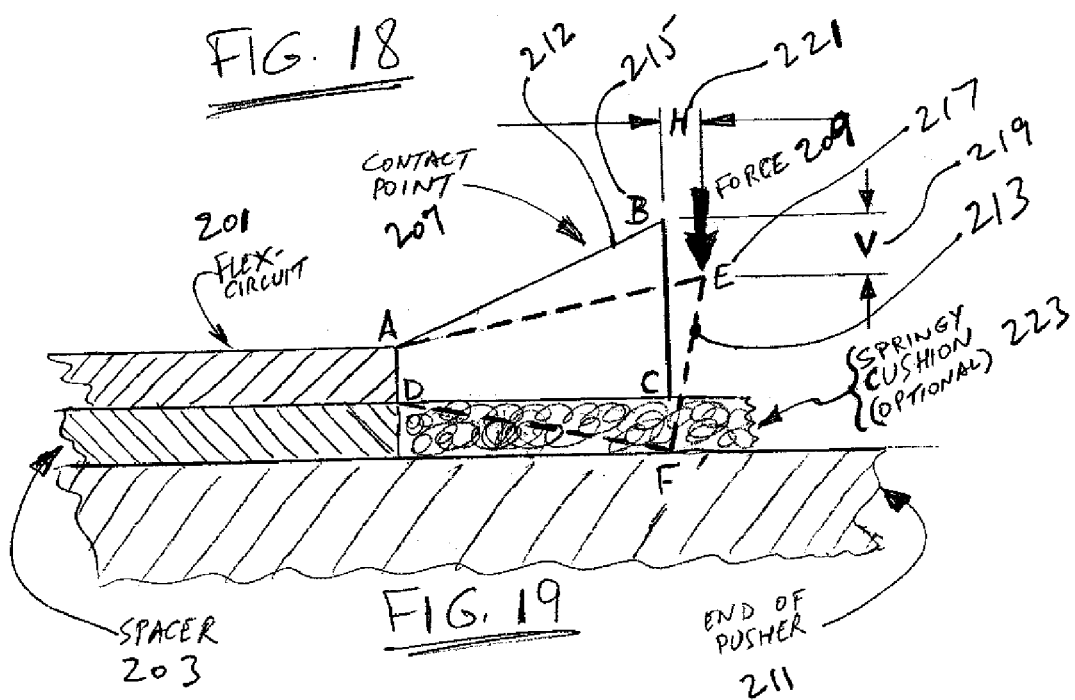

FIGS. 18 and 19 show a method which allows the contact points of a membrane or a flexible circuit, to flex independently from adjacent contact points, to accommodate for non-planarity in the device under test.

Figure 20:
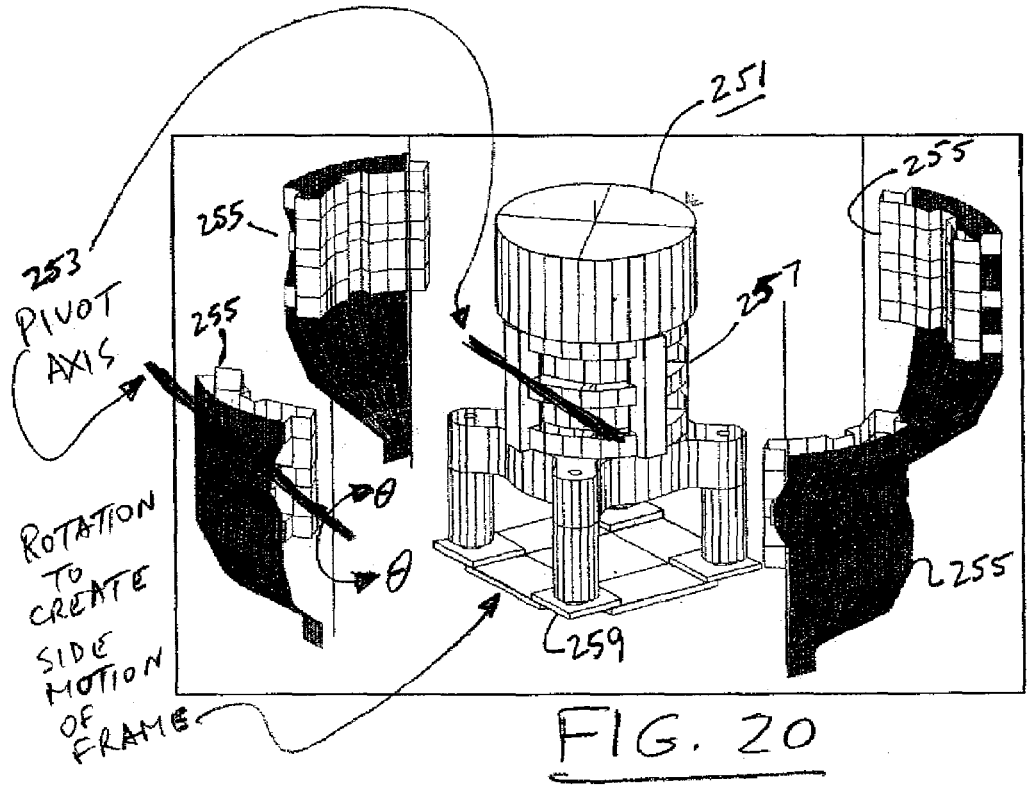
Figure 21:
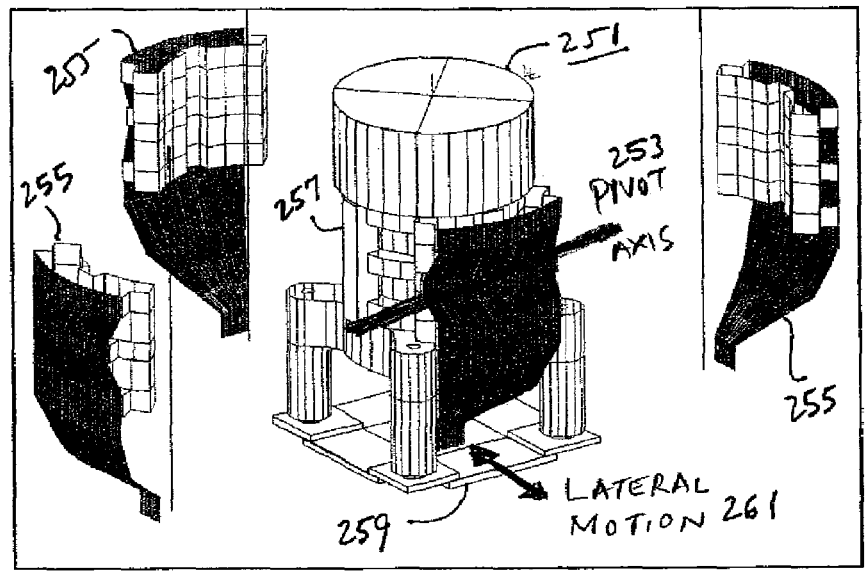

FIGS. 20 and 21 show a tool that can be used to carry and to drive the segments of the pusher shown in FIGS. 15, 16 and 17. The exploded views show the individual segments of the tool and their pivot axed.

Figure 22:
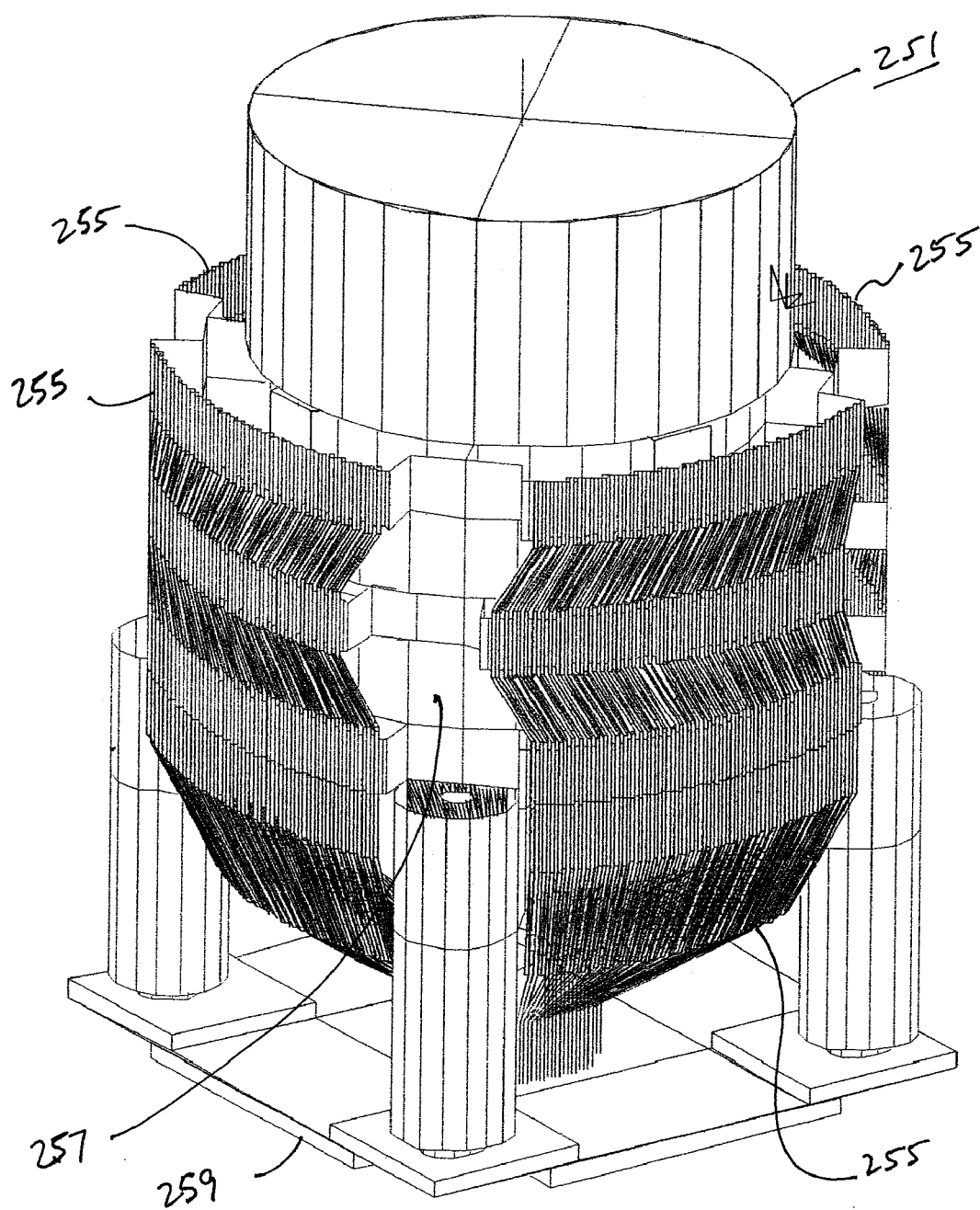

FIG. 22 shows the tool shown in FIGS. 20 and 21, but here the tool segments are shown assembled on the tool core.

FIG. 23 shows a segment of a "straight" suction cup, and it demonstrates the creation of wipe or scrub from the vertical motion of the head or body of the device.

FIG. 24 shows a multi-contact point, on a "straight" suction cup.

SPECIFICATIONS

Description of the Preferred Embodiments

While the invention is susceptible of various modifications and alternative constructions, certain illustrative embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

While I am describing the drawing in more details, I will at the same time explain the technology basis of the invention. I will also include a number of examples in this section, which should be considered as part of the embodiments for the purpose of this application as well.

This description covers more than one invention. The inventions are based partly on the same technology platform, but then each of the inventions has some additional features of its own. Not being an expert in handling patents, I would like to leave it to the patent examiner to decide on the number of the inventions contained and how to split one invention from the other.

DESCRIPTION OF THE INVENTION

There are several inventions here. I will describe each one of them as we go along. I will group them in two separate groups: I will refer to the first group as the "Side Actuation"

embodiments, while the second group will be referred to as the "Spreading Actuation" group.

Group 1

Side Actuation

Preferred Embodiments

Embodiment #1

Membrane Probe, with Frame and Pusher

FIGS. 1 through 4 show what I would like to call the "Membrane Probe".

Figure 1:
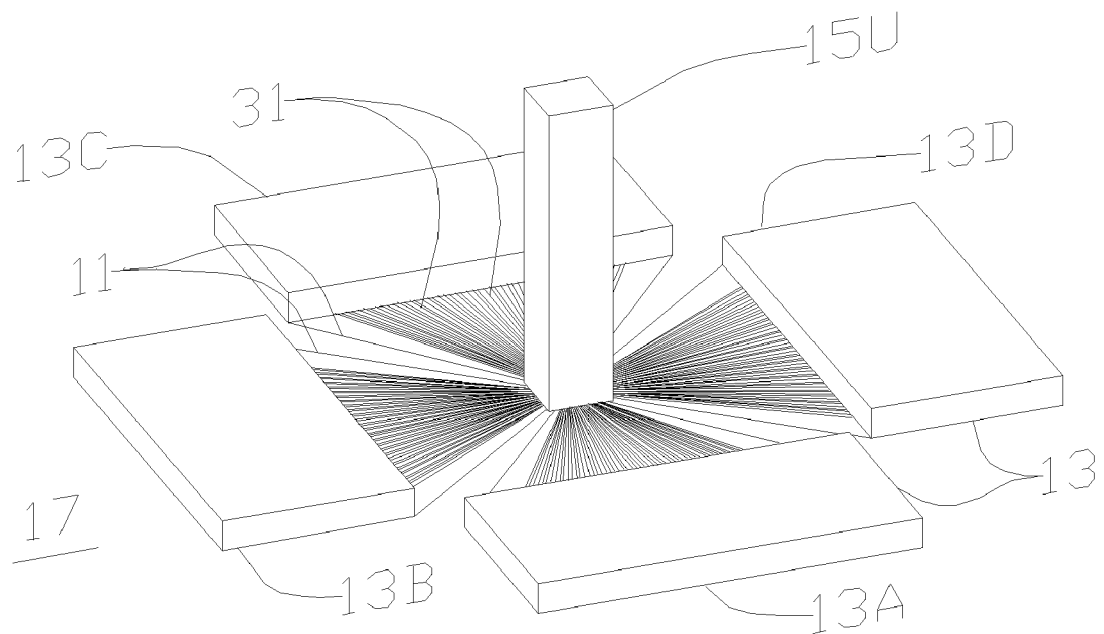

FIG. 1 shows the "membrane" 11, which can be like a flex-circuit, stretched between the sides of a "frame" 13. The "pusher" 15 is located at the center of the membrane. The whole set up 17 is located on top of the device-under-test 21 (DUT), not shown, such that the contact points 19 (CPs), not visible here, of the membrane are positioned on top of the contact pads 29 of the DUT 21. At this position, the membrane 11 is still high enough so that there is still no touching between it, i.e. its CPs 19 and the DUT 21. The CPs 19 are located underneath the footprint of the pusher 15.

The membrane 11 is stretched between the four sides 13A, 13B, 13C and 13D, of the frame 13 and the pusher 15 is located on top of it, roughly at the center of the membrane 11. The membrane 11 contains the traces 31, which connect the CPs 19 to the outside world.

The idea of using a flex-circuit is because we can get traces on flex-circuits that are on small center distances (pitch) 33 and can "image" the circuit to fine details and close definition. We can also create "bumps" 37 on the flex-circuit 11. This can be done by a number of methods well known to the industry. We can also embed particles 45 in the bumps 37. For example, we could have a copper ball 47, not shown, in each bump. We could also have diamond particles 49, not shown, in the bumps 37. All this is done to match the flex-circuit 11 to the needs of the specific application and situation. Other materials or boards or substrates could be used as well, i.e. not just flex-circuits. For example, we could use a Flex-Rigid membrane, not shown, where the CPs 19 are on the Rigid part of the Flex-Rigid membrane, and the Flex part of the Flex-Rigid would act as the flexible component. In this case, we would need to cushion the CPs 19, to accommodate non-planarities of the DUT, for example by having each contact element being articulated, so as to deflect slightly in the direction generally perpendicular to the surface of the DUT contact elements.

Figure 2:
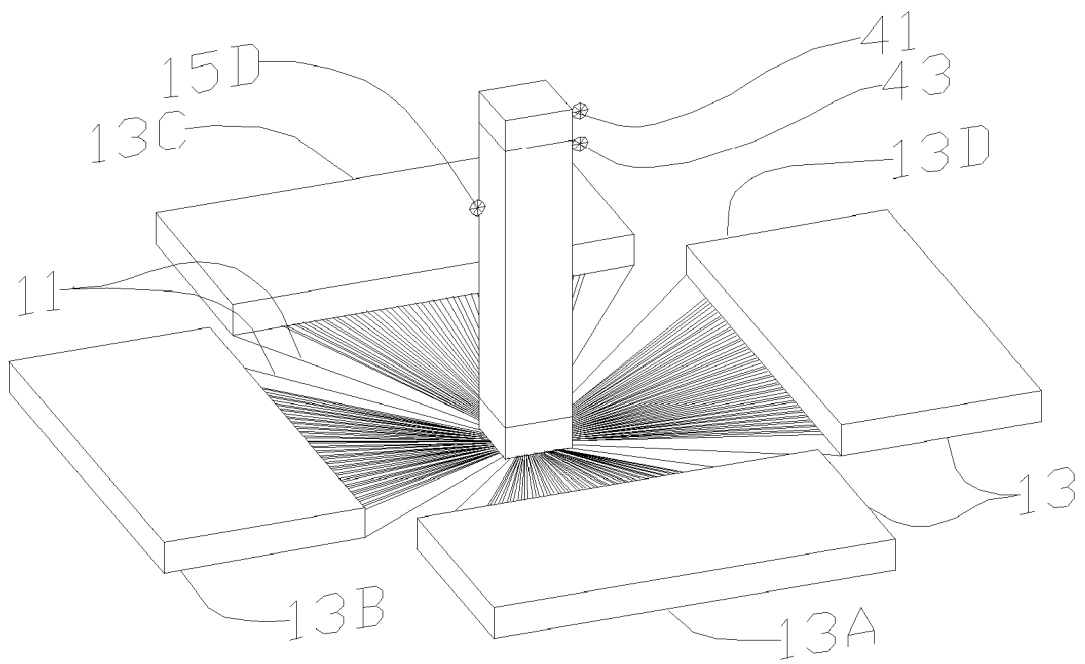

FIG. 2 shows that the pusher 15 has been actuated, i.e. moved from its rest position 41 to its lower operating position 43, so that it has pushed the membrane 11 down, so that the CPs 19 now have touched the contact pads 29 of the DUT 21.

Figure 3:
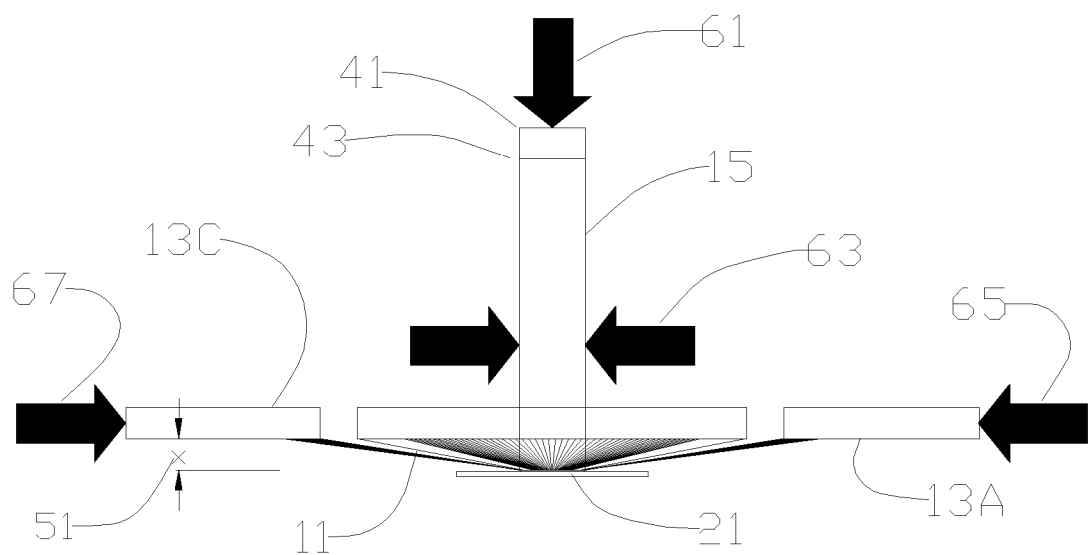

FIG. 3 shows an end view, or side view, of the setup 17. You can see that the frame 13 is above the DUT 21, with a predefined space or distance 51 between the two. In FIG. 3, the pusher is shown in its lower position, where it has pushed the membrane down and where the membrane's CPs 19 have touched the DUT 21.

Figure 4:
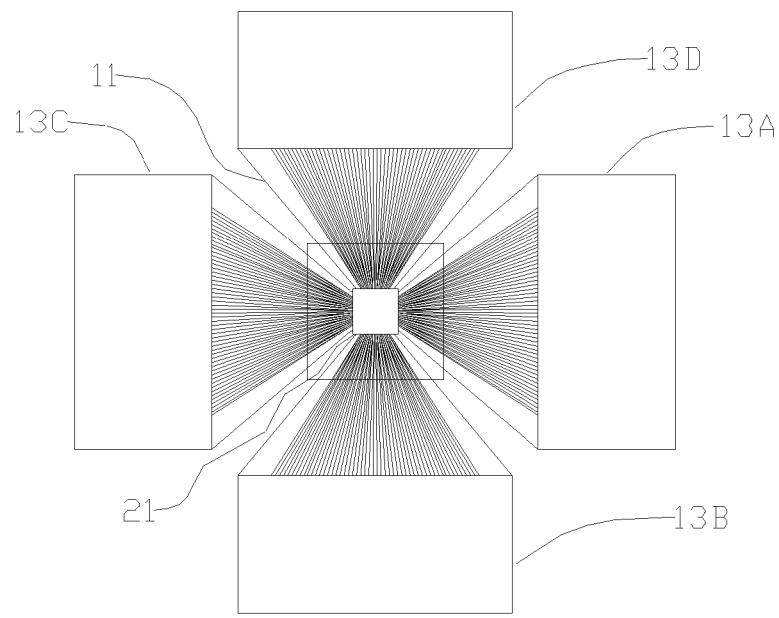

FIG. 4 shows a top view of the setup, albeit to a smaller scale.

In certain cases, the down push may be enough to create satisfactory electrical contact between the CPs 19 of the membrane 11 and the contact pads 29 of the device 21.

In other cases, the down push may not be enough. We would need a large contact force to penetrate through the expected layers of oxides and foreign matters on the contacting surfaces. If we apply too much of a force, we may damage the device or its contact pads. A preferred way is to have some "scrub" or "wipe", to clear a path through these layers, to reach the clean base metal surfaces. This way we would need a much smaller contact force to create a good reliable electrical connection between the contact elements.

In order to create this scrub or wipe, we add a "side motion" to the setup 17. Both the pusher 15 together with the frame 13, would be actuated sideways, so that the CPs 19 of the membrane 11 would slide sideways with respect to the device 21. The side motion 63 may be ever so small, but it would be controlled to accomplish the desired goal. The goal is to create the desirable "scrub" or "wipe". As I said, this scrub or wipe pushed the oxides or films of dirt or the like out of the way, so that the two contacting surfaces would reach the base metal, i.e. the clean surfaces, so that a good electrical contact is achieved.

The side motion 63 and/or 67 is accomplished by applying a force to the system 17. This can be a force "F" 61 applied to the pusher and/or a force 63 applied to the frame, while the DUT 21 is fixed in space, so that a relative motion occurs between the membrane CPs 19 and the DUT contact points 29. It can also be reversed. In other words, the membrane setup 17 would be fixed in space, while the DUT 21 would be moved sideways. In any case, there would be a relative motion, to create the same kind of wipe or scrub.

Please note that the frame 13 is shown as if it is composed of four different segments 13A, 13B, 13C and 13D. This is optional. It could stay this way, or it could be made as one piece, depending on whether we want to actuate each segment by itself or all the segments together at the same time.

FIG. 5 shows one embodiment of a tool or fixture 61 for such a setup. The main body of the fixture would comprise four posts 63 to hold the frame 65 and a pusher actuator 67 to move the pusher 15 up and down. The fixture head 69 could be fixed in space in a machine collet or clamp. The tool 61 would have some internal mechanism to create the up and down movement of the pusher 15, as well as the lateral movement of the pusher and membrane. Or the fixture would only have the up and down movement of the pusher, in which case the lateral movement would be provided by the other part of the machine, which is holding the DUT 21.

FIG. 6 shows one embodiment of the membrane 11. It really shows the "traces" 31 of the membrane 11, which are embedded in, or are part of, the flex-circuit 71. The flex-circuit 71 can be segmented, like in four segments 71A, 71B, 71C and 71D in the figure, for ease of handling and mounting or fixturing.

FIG. 7 shows a 3-D view of the fixture 61 with the flex-circuit 71 extending beyond the frame. Again, I am highlighting the traces 31 here, leaving out, i.e. not showing, the flex circuit 71 itself.

Another point to make here is the impedance control feature. The flex-circuit 71 can be made of multilayers, so that some layers would act as shield or ground and such that the combination of the total effect would create proper impedance control to the traces.

2) The fixture 61 shown here has also been used in my Non-Provisional Utility patent application Ser. No. 09/947,240, filed on Sep. 5, 2001, entitled "Interconnection Devices", which was mentioned as Reference #2 at the beginning of this present application.

Embodiment #2

Pusher, No Frame (81)

FIG. 8 shows a simplified version of above embodiment #1. I will call this the simplified pusher 81. Please notice that the pusher here is shown upside down, i.e. in the reverse position compared to the previous figures. Here, the complete flex-circuit 71 can be wrapped around the pusher. Again, the flex-circuit can be scalloped 73 or slit at the corners 75 of the pusher, for ease of manufacturing. In this case, the pusher 15 will do the whole job, all by itself. It will push down to create the up and down motion 77 and also will do the side motion 79.

FIG. 9 shows the flex-circuit widening up at the periphery 83. This is optional and would be desirable if the pitch 33 at the CPs 19 is too small. It may be desirable to widen the pitch 85 at the other end 83 of the traces, so that those traces can be connected more easily to the outside world. This gets us back practically to the flex-circuit 11 shown in the earlier figures. In this FIG. 9, I am not showing how the wider ends of the flex-circuit are supported. This can be optional. It can be done as shown in the earlier figures, or it can be done in any other ways. For example, the pusher itself would have different dimensions. At the contact end 87, where there will be contact with the DUT 21 the pusher can be narrow, while at points farther away from the contact end, the pusher would be wider, as at the shoulder 89. In other words, the pusher could be tapered or stepped appropriately.

Embodiment #3

Multi-Chips, Row or Cluster (91)

FIG. 10 shows another embodiment, which I will call the multi-chip probe 91. Here we can connect to more than one chip. We can have a row of chips or even a cluster, i.e. more that one row. It will mostly depend on the ability of connecting the CPs 19 to the outside world, e.g. how many traces can we have/use on the flexible circuit between the CPs 19.

FIG. 11 shows the flex-circuit for the embodiment in FIG. 10.

Group 2

Spreading Actuation

Embodiment #4

Suction Cup Type (101)

FIG. 12-A shows a suction cup 101. This is a regular suction cup 101, similar to those used to hang gadgets from the wall or off the refrigerator's door or the window glass pane. Similar cups, though usually much smaller, are also used to pick up chips using vacuum.

If we place such a suction cup 101 on top of a table top or any flat smooth surface, but do not push down on it to compress it, it would look more or less like in FIG. 12-A. If we do compress it down, it would look more or less like in FIG. 12-B.

If we analyze what happens, we would notice that the rim 103 of the suction cup 101 does get slightly wider or larger in diameter when compressed from the situation in FIG. 12-A to that in FIG. 12-B. The deformation would create something comparable to the desired "wipe", as explained here below.

The rim, as represented by point 103, would stretch outwards. In the cross-sectional views in FIG. 12-A, when the suction cup 101 is at rest, in the top figure, the rim 103 is at point 105. By pushing down on the top 111 of the cup 101, and compressing it from the original height 113 to the lower height 115, as in the bottom figure, we force the lip 103 to move out from point 105 to point 107.

If the rim 103 were a contact element and if the tabletop were an electrical surface, then the length of travel 117 would represent the scrub or wipe that we would get. This leads us to the next figure.

Embodiment #4b

Suction Cup Probe (121)

FIGS. 13-A and 13-B show a device, that could look like a suction cup, but with one big difference. Here, we have provided a flexible circuit 123, something like the flex-circuit mentioned above, on the inside surface of the suction cup 125. Now, if we place such a suction cup probe 121 on top of a chip or similar DUT 21, and push down on the cup 125, we would connect the CPs 19 of the flex-circuit 123 to the contact pads 29 on the DUT 21.

We can see that CPs 19 have moved. In the top FIG. 13A, CPs 19 were at the inside ends of contact pads 29 on the DUT 21. Later, after compressing 125, we notice that CPs 19 have moved outwards to the outside edges of contact pads 29 on the DUT 21. This creates the desirable wipe or scrub 117.

By controlling the amount of the down push and the deformation of the edges of the suction cup 125, we can control the magnitude of the wipe 117 that would be created.

One small additional detail here. We better provide some "vent hole(s)" 127 in the body of the suction cup 125, so that we do not "grab" the DUT 21 so tightly, that we won't be able to let go of it afterwards.

So, we could make probes as shown in FIGS. 13-A and 13-B. I would like to refer to these as the "Suction Cup Probes" 121.

Some Variations on the Above Embodiment

The concept described in FIGS. 13-A and 13-B, called "suction cup probe" 121, is assuming that the cup would look like most conventional suction cups, i.e. circular in shape. We can take this concept and do it on a straight line, as in FIG. 23.

FIG. 23 shows a portion of a suction cup, like the probe 131, but with "straight" edges. Please excuse the non-continuous sequence in the numbers of the Figures.

The suction cup 121 has a circular rim. If we visualize that we take a section of the cup and open the circle to create a straight line, then we would get something like what is shown in FIG. 23. Let's call that the "straight suction cup" 271.

Of course, this suction cup will not provide any "suction" per se. But, we are not looking for suction. We are more interested in the deformation of the device and its ability of transforming a vertical push 293 on it, say by a force 291, on its top 273, and to create out of that, a horizontal motion 295 at its tip 277. In essence, this kind of transformation of the movements is what I refer to as the "suction cup effect".

This device 271 would still function in a similar way.

The advantage here is that we can now use this to work with standard conventional packages or chips, which have their contact pads usually along some straight lines. Such a probe would work with such chips or packages.

FIG. 24 shows a multi-line straight suction cup 301. Here we can see that a number of straight suction cups 303 have been stacked together, with some spacers 315, as needed. Each member 303 has its "foot" 305, provided with appropriate flex circuit members, or the like, which have the contact elements 307, which in turn would make electrical contact with the contact elements 309 of the DUT 311. All what we have mentioned above, relating to the "foot" 271 would apply here as well.

Embodiment #5

Modified Suction Cup Type (Suction Pusher) (151)

FIGS. 14A, 14B and 14C shoe a sort of a combination of the embodiments #2 and 4b. Here, we have a pusher like in Embodiment #2, but the pusher 153 has a tip 155 that is made of a relatively soft/flexible material. The tip 155 is also shaped to have a taper or the like, to roughly simulate the shape of the tip of suction cup 101 tip or rather the 4A 131 or 4B 141. The two cross-sections in FIGS. 14A and 14B, at the top of FIGS. 14A, 14B and 14C, show what would happen when the pressure is applied. The lip 157 of the tip 155 would squeeze open and would create the displacement 159 that would create the desirable wipe. The lower 3-D figure, FIG. 14C, shows how the flex-circuit could be applied to the pusher, e.g. draped over and glued.

Embodiment #6

Segmented Pusher, Stretchable Flex-Circuit (171)

FIG. 15 shows a probe 171, based more or less on the idea shown in Embodiment #5, 151 in FIGS. 14A, 14B and 14C. Here, the pusher 173 is made of segments 175, where each segment could be actuated to open up in the direction of the arrows 177A, 177B, 177C and 177D, shown in the figure. The actuation can be achieved by some cam mechanism, not shown. Or the side motion can be done with all the segments moving together in one lateral direction or the other.

FIG. 16 shows the pusher of FIG. 15, together with the flex-circuit 181 draped over it. Here, the flex-circuit 181 is made in such a way, that its central portion 183 is stretchable. So, when the individual segments 175 of the pusher 173 are opened up to create the wipe, this stretchable central area 183 of the flex-circuit 181 would allow this motion to occur without obstruction.

Another way to make this work is to use individual segments of flex-circuit, so that each segment of the pusher would have its own segment of flex-circuit. See next figure.

Embodiment #7

Segmented Pusher, Segmented Flex-Circuit (191)

FIG. 17 shows a setup similar to the one in FIGS. 15 & 16, except that here each segment 193 of the pusher 191 has a segment of the flex-circuit 195 attached to it. This way, we eliminate the need to have the "stretchable" portion 183 of the flex-circuit 181 mentioned in FIG. 16.

Embodiment #8

Flexible Contact Points (201)

FIG. 18 shows an additional approach to the problem. It shows a cross-section in the flex-circuit 201. It could be the flex-circuit used in FIG. 8 or 10. The flex-circuit 201 is sitting here on a "spacer" 203, which is provided between the flex-circuit 201 and the end surface of the pusher 211 (equivalent to the end of the pushers 15, 87, 173/175 or 191/193 in the previous figures) or a solid backing surface of some sort, like the "Rigid" portion of the Flex-Rigid flexible circuit mentioned earlier. The spacer 203 has a "cavity" or "hole" 205 at the spot beneath the contact point 207 of the flex-circuit 201.

FIG. 19 shows an enlarged view of one of the contact points.

When the flex-circuit 201 is at rest and not under any pressure, the contact point is at the position ABCD 212, as shown by the solid lines of the contact point 207. When a force "FORCE" 209 is applied, then the contact point is pushed against the end of the pusher 211, moving down into the "hole" 205 of the "spacer" 203. It finally rests in a position like the one shown as AEFD 213, which is shown in "dotted or dashed lines".

It is obvious from the geometry in the drawing of FIG. 19 that point B 215 has moved to point E 217. This is the result of the applied force 209 pushing the contact point 215 down through the distance "V" 219. While this is happening, the point B 215 moves also sideways, i.e. laterally through the distance "H" 221. This lateral movement is what creates the desirable "wipe".

By selecting the material and the thickness of the flex-circuit 201 and of the spacer 203 properly, and by selecting the dimensions of the contact point 207, as presented here by "ABCD" 212, we can design the magnitude of the wipe 221 to whatever we need or want. It is basically a matter of geometry.

The material of the flex-circuit 201 needs to be considered as well. For example, the springiness or stiffness of the material would tell us whether the contact point would go back to its original position 212, when the pressure or force 209 is removed. This is necessary so that when we apply the force 209 again a second time, we would get the same amount of wipe 221. Because, if the contact point stays down, then we would not get any wipe at subsequent cycles. So, to ensure that the contact point would revert back to its original position 212, then we may opt to put a "cushion" 223 underneath it, in the "cavity" or "hole" 205 of the spacer 203. We could use some kind of elastomeric material or foam or the like. The spacer 203 itself should preferably be rather stiff or non-elastic, so as to retain its thickness (height) so as to create the "rotation" of the contact point 207, which in turn would create the "V" 219 and "H" 221 dimensions consistently.

GENERAL NOTES

1. The CPs 19 on the flex-circuit 11 should have some raised surfaces above the general surface of the flex-circuit 11 itself. This would promote good electrical contact with the contact pads 29 of the DUT 21. The raised surface CPs 231, not shown, could be made chemically or by deposition, like "growing" them on the flex-circuit, or mechanically, like with a "gold dot", or by using diamond grit, or by any other method know in the industry. Of course, they have to be located in such a way so as to match the corresponding location of the respective contact pads 29 of the DUT 21.

2. We could also add a "cushion" 155 to any or all of the above pushers. This is shown in FIGS. 14A, 14B and 14C through 17. The cushion would have to have a special amount of hardness. The whole purpose of such a cushion is so that the contact pads 29 on the DUT 21 would not get scratched too badly and get damaged. On the other hand, if the cushion is too soft, then the raised CPs 19 on the flex-circuit 11 would get depressed into the cushion and would not make good contact on the contact pads 29 of the DUT 21.

3. In the referenced Non-Provisional Utility patent application Ser. No. 09/947,240, filed on Sep. 5, 2001, entitled "Interconnection Devices", I have shown some devices that could be helpful for this invention. FIGS. 88 through 90 of that Application showed a vertical probe with segments that can be clamped on to a core. FIGS. 20 through 22 of this present application show the same vertical probe 251, with some slight modifications. FIG. 20 shows a "pivot axis" 253 which could be used to mount the segments 255 to the core 257. We could use the segments to drive the frame 259, so that we can move the frame laterally 261, as shown in FIG. 21. FIG. 22 shows the core 257 with all the four segments 255 mounted onto it. Please note that the fixture 61 shown in FIGS. 5 and 7 are similar to the ones just described here.

I claim:

1. A method for electrically connecting to a device, using a probe, said device having:

a top surface generally along a plane, referred to as the x-y plane, said top surface referred to as device surface; at least a first and a second contact pads, referred to as device pads, said pads being disposed on and along said device surface, in a pattern, referred to as the device pattern; and the top surface of said device pads, referred to as pads surface, being generally parallel to said device surface; and with a center distance between the center of said first device pad, and the center of said second device pad, said center distance being referred to as the device pitch;

said probe comprising:

a first contact means, referred to as probe point, disposed on a carrier, wherein said carrier having means for electrically connecting said probe point to the outside world, and a second probe point, similarly disposed on said carrier, and similarly connected to the outside world, said first and second probe points being disposed in a pattern, referred to as the probe pattern, said probe pattern matching said device pattern, and with the center distance between the center of said first probe point; and the center of said second probe point, referred to as probe pitch, said probe pitch being equal in size to said device pitch, and said carrier being mounted on a working tip of a pusher, said pusher being capable of moving said working tip and said probe points in several directions; a first direction being generally perpendicular to said device surface and said pads surface, said perpendicular direction being referred to as the z-direction or the normal direction of said working tip, and a second direction being generally parallel to said device surface, along an arbitrary direction within said x-y-plane, referred to as the first lateral direction of said working tip, and a third direction again being generally parallel to said device surface, but at some angle to said first lateral direction, referred to as the second lateral direction of said working tip;

wherein said method comprises the steps of moving the working tip in the normal direction, towards said device and said device pads, creating a normal force between said probe points and said device pads, said normal force being transferred from said pusher, then through said working tip of said pusher, and then through said carrier, and moving said working tip in the first lateral direction, while said normal force is still existing, thus creating a relative motion and a wiping action between said probe points and said device pads, in a direction parallel to said first lateral direction, said wiping action being referred to herein as the first lateral wipe or scrub, and moving said working tip in the second lateral direction, while said normal force is still existing, thus creating a relative motion and a wiping action between said probe points and said device pads, in a direction parallel to said second lateral direction, said wiping action being referred to herein as the second lateral wipe or scrub.

2. A probe for electrically connecting to a device, as the probe described in the method of claim 1.

3. A probe for electrically connecting to a device, said device having:

a top surface generally along a plane, referred to as the x-y plane, said top surface referred to as device surface; at least a first and a second contact pads, referred to as device pads, said pads being disposed on and along said device surface, in a pattern, referred to as the device pattern; and the top surface of said device pads, referred to as pads surface, being generally parallel to said device surface; and with a center distance between the center of said first device pad, and the center of said second device pad, said center distance being referred to as the device pitch;

said probe comprising:

a first contact means, referred to as probe point, disposed on a carrier, wherein said carrier having means for electrically connecting said probe point to the outside world, and a second probe point, similarly disposed on said carrier, and similarly connected to the outside world, said first and second probe points being disposed in a pattern, referred to as the probe pattern, said probe pattern matching said device pattern, and with the center distance between the center of said first probe point; and the center of said second probe point, referred to as probe pitch, said probe pitch being equal in size to said device pitch, and said carrier being mounted on a working tip of a pusher, said pusher being capable of moving said working tip and said probe points in several directions; a first direction being generally perpendicular to said device surface and said pads surface, said perpendicular direction being referred to as the z-direction or the normal direction of said working tip, and a second direction being generally parallel to said device surface, along an arbitrary direction within said x-y-plane, referred to as the first lateral direction of said working tip, and a third direction again being generally parallel to said device surface, but at some angle to said first lateral direction, referred to as the second lateral direction of said working tip;

wherein when the working tip is moved in the normal direction, towards said device and said device pads, it creates a normal force between said probe points and said device pads, said normal force being transferred from said pusher, then through said working tip of said pusher, and then through said carrier and said probe points, and when the working tip is moved in the first lateral direction, while said normal force is still existing, a relative motion and a wiping action between said probe points and said device pads is created, in a direction parallel to said first lateral direction, said wiping action being referred to herein as the first lateral wipe or scrub, and when the working tip is moved in the second lateral direction, while said normal force is still existing, a relative motion and a wiping action between said probe points and said device pads is created, in a direction parallel to said second lateral direction, said wiping action being referred to herein as the second lateral wipe or scrub.

4. A probe as recited in claim 3, wherein said carrier comprises several layers of conductors and insulations, say for signals and/or power or shielding or ground.

5. A probe as recited in claim 3, wherein said carrier is partitioned into more than one independent carrier segment.

6. A probe as recited in claim 3, wherein said carrier is a flexible circuit, referred to as flex-circuit.

7. A probe as recited in claim 6, wherein said flex-circuit is draped over said working tip of said pusher.

8. A probe as recited in claim 6, wherein said flex-circuit is attached to a support frame to hold it in its operating positions.

9. A probe as recited in claim 3, wherein said angle between said first lateral direction and said second lateral direction is 90 degrees, in which case we refer to these two directions as the x- and y-directions.

10. A probe as recited in claim 3, wherein said working tip moves only in only one of said two lateral directions parallel to said device surface and said device pads surface, say along said first lateral direction.

11. A probe as recited in claim 3, wherein said working tip moves in a composite vectorial direction parallel to said device surface and said device pads surface, with a component of the motion in said first lateral direction and another component in said second lateral direction.

12. A probe as recited in claim 3, wherein a flexible member, referred to hereinafter as the cushion, is disposed between said working tip of said pusher and said carrier, said cushion having two end surfaces, a first end surface being attached to the end surface of said working tip of said pusher and a second end surface attached to said carrier, one purpose of said cushion is to transmit said normal force from said pusher to said carrier to said probe points and then onto said device pads, and a second purpose is to accommodate any potential non-planarity of the top surfaces of said device pads.

13. A probe as recited in claim 12 wherein said cushion is shaped so that it maintains its relatively normal geometric shape, when said normal force is applied by said pusher, and said second end surface of said cushion does not expand or move laterally.

14. A probe as recited in claim 12, wherein said cushion is shaped so that when said normal force is applied by said pusher, said second end surface of said cushion does move laterally sideways, with respect to said first end surface of said cushion, and moves with it said carrier and said probe points laterally sideways, and creates a wipe between said probe points and said device pads.

15. A probe as recited in claim 14, wherein said carrier is segmented or stretchable and can accommodate said lateral sideways movement of said second end surface of said cushion.

16. A probe as recited in claim 13, wherein said pusher comprises at least two independent pusher segments, each one of said pusher segments has its own independent working tip and independent cushion and independent carrier and probe points, and each of said pusher segments is capable of moving its own working tip in any of said normal direction and said first and second lateral directions, and creates its own normal force and its own wipes, independent of the motions of the other pusher segments, and regardless of whether any of the other pushers is moving or not.

17. A probe as recited in claim 13, wherein said pusher comprises four independent pusher segments, disposed in a square pattern, with a first pair of said pusher segment facing each other and a second pair of said pusher segments also facing each other but disposed at 90 degrees with said first pair, each one of said pusher segments has its own independent working tip and its own independent cushion and its own Independent carrier segment, and said first pair of said pusher segments, together with corresponding said working tip and cushions and carrier segments, moves in the direction of a first of said two lateral directions, while said second pair of said pusher segments, together with corresponding said working tips and cushions and carrier segments, moves in the direction of said second lateral direction, thus said first pair of said pusher segments creates wipe in the direction of said first of said two lateral directions, while said second pair of said pusher segments creates wipe in the direction of said second of said two lateral directions.

18. A probe as recited in claim 3, wherein each one of said probe points is constructed so that it has its own flexible joint, so that it can move independently from any other probe points, and with an appropriate space underneath it, so that when the tip of said probe point moves perpendicular to the general surface of said carrier, said tip would move laterally, parallel to the general surface of said carrier, thus it would accommodate a certain amount of non-planarity in the device pad surfaces and it would create a certain amount of lateral wipe.

19. A probe as recited in claim 18, wherein said space underneath said flexible joint and/or probe point is partially filled with a springy material, to control the flexibility and repeatability of said flexible joint and/or probe point and to ensure repeatability of said normal force and resulting wipe.

20. A probe as recited in claim 18, wherein a spacer is provided between said carrier and said pusher, to provide the required space underneath said probe point, and to control the amount of normal and lateral movements of said flex joint.

* * * * *